United States Patent
Miyamoto

[11] Patent Number: 5,965,914
[45] Date of Patent: Oct. 12, 1999

[54] THIN FILM TRANSISTOR HAVING A BRANCHED GATE AND CHANNEL

[75] Inventor: Shoichi Miyamoto, Tokyo, Japan

[73] Assignee: Mitsubishi Denki Kabushiki Kaisha, Tokyo, Japan

[21] Appl. No.: 08/996,811

[22] Filed: Dec. 23, 1997

[30] Foreign Application Priority Data

Jun. 18, 1997 [JP] Japan .................................. 9-16118

[51] Int. Cl.⁶ .......................... H01L 29/76; H01L 31/62
[52] U.S. Cl. ................................. 257/331; 257/401
[58] Field of Search .................................. 257/241, 250, 257/266, 287, 331, 401

[56] References Cited

U.S. PATENT DOCUMENTS

| | | | |
|---|---|---|---|
| 5,338,959 | 8/1994 | Kim et al. | 257/331 |
| 5,372,959 | 12/1994 | Chan | 438/157 |
| 5,583,362 | 12/1996 | Maegawa | 257/347 |

FOREIGN PATENT DOCUMENTS

| | | | |
|---|---|---|---|
| 6265346 | 9/1985 | Japan . | |
| 6388844 | 10/1986 | Japan . | |
| 63-250155 | 4/1987 | Japan . | |
| 4-501937 | 9/1989 | Japan . | |
| 3-133158 | 10/1989 | Japan . | |
| 4-114437 | 9/1990 | Japan . | |
| 6-85263 | 1/1993 | Japan . | |
| 6-112482 | 4/1994 | Japan | 257/401 |
| 91/04574 | 4/1991 | WIPO . | |

Primary Examiner—Valencia Martin-Wallace
Assistant Examiner—George C. Eckert, II
Attorney, Agent, or Firm—McDermott, Will & Emery

[57] ABSTRACT

A thin-film transistor has a channel having a plurality of branch channels, and a gate having a plurality of branch gates. At least one of or all of the branch channels are surrounded by the branch gates in a three dimensional way. That is, the branch channels and the branch gates are formed so as to intersect each other in a three-dimensional space so that the branch channels are surrounded by the branch gates, and the branch gates are surrounded by the branch charnels. Consequently, the area of the channel is increased and the current capacity is enhanced. Thus, a thin-film transistor is obtained which takes a small area and has a large current capacity.

13 Claims, 23 Drawing Sheets

THIN FILM TRANSISTOR HAVING A BRANCHED GATE AND CHANNEL

BACKGROUND OF THE INVENTION

1. Field of the Invention

The present invention relates to a semiconductor device formed by a semiconductor thin film, and a method of fabricating such a semiconductor device.

2. Background Art

A polysilicon thin-film transistor (hereinafter referred to as TFT) is employed as a load element in a low-power SRAM. The TFT must take a small area and have a large current capacity to form an SRAM having an improved ability and a high degree of integration. The conventional gate all around TFT with a gate electrode wound around a channel polysilicon film has current capacity twice that of a single-gate TFT having the same area.

FIGS. 49 to 51 show a conventional polysilicon thin film transistor. FIG. 49 is a perspective view of the thin-film transistor, FIG. 50 is a sectional view taken on line A-A' in FIG. 49, and FIG. 51 is a sectional view taken on line B-B' in FIG. 49.

Shown in FIGS. 49 to 51 are a silicon substrate 1, a silicon dioxide film 2 formed on a surface of the silicon substrate 1, a channel polysilicon film 6 serving as the channel of a thin-film transistor, a silicon dioxide film 7 formed over the surface of the polysilicon film 6 and the surface of the silicon dioxide film 2, and a gate polysilicon film 8 serving as the gate of the thin-film transistor. The silicon dioxide film 7 between the channel polysilicon film 6 and the gate polysilicon film 8 serves as the gate oxide film of the thin-film transistor.

In this thin-film transistor, the gate 8 consists of a bottom branch gate 8a formed on a surface of an insulating film, and a branch gate 8b branching from the bottom branch gate 8a, extending over the bottom branch gate 8a and having through holes extending therebetween.

The channel 6 is formed so as to branch from one side of the branch gates 8a and 8b, i.e., from one side of the through hole of the gate 8, and pass the through hole of the gate 8.

A gate oxide film 7 is formed between the channel 6, and the branch gates 8a and 8b.

A source/drain region, not shown, is connected to the channel 6 on the sides of the branch gates 8a and 8b, i.e., on the opposite sides of the through hole of the gate 8.

FIGS. 52 to 56 are views for explaining a method of fabricating the foregoing conventional semiconductor device. The conventional semiconductor device fabricating method will be described with reference to FIGS. 52 to 56.

Referring to FIG. 52, a silicon dioxide film 2 of a predetermined thicknesses formed on a silicon substrate 1 by, for example, a thermal oxidation process. A silicon nitride film 3 of a predetermined thickness is deposited by, for example, a reduced pressure CVD process. Then, the silicon nitride film is patterned in a strip of a width corresponding to that of the channel of a desired 5 transistor.

Referring to FIG. 53, polysilicon is deposited over the surface of the workpiece to form a channel silicon film 6. Polysilicon not containing any impurity is deposited in a polysilicon film of a predetermined thickness, and the polysilicon film is patterned by a photolithographic etching process to form the channel silicon film 6 of a desired pattern.

Then, as shown in FIG. 54, the silicon nitride film 3 is removed entirely by, for example, immersing the workpiece in a hot phosphoric acid solution of 150° C. Consequently, an opening is formed in the channel silicon film 6.

Referring to FIG. 55, a gate silicon dioxide film 7 of a predetermined thickness, i.e., a gate insulating film, is deposited over the entire surface of the workpiece so as to cover a first silicon dioxide film 1 and the channel silicon film 6 entirely.

Referring to FIG. 56, a gate polysilicon film 8 doped with phosphorus (i.e. doped polysilicon film) is deposited in a predetermined thickness over the entire surface of the workpiece by a reduced pressure CVD process. The opening formed in the channel silicon film 6 is filled up with the second polysilicon film 8 because the film deposited by the reduced pressure CVD process has an excellent coverage.

Referring to FIGS. 49 to 51, the gate polysilicon film 8 is patterned by a photolithographic etching process in a desired pattern to form a gate electrode.

Then, source/drain implantation is carried out for end portions of the channel silicon film 6 by using the gate electrode 8 superposed on the channel silicon film 6 as a mask. An interlayer insulating film is formed, and wiring lines, such as aluminum lines, are formed so as to extend from the source/drain region to complete a 10 desired transistor, although not shown.

The foregoing gate all around TFT,having the gate electrode wound around the channel polysilicon film has a current capacity twice that of a single-gate TFT taking the same area. If the degree of integration of a low power SRAM increases, a TFT having a smaller area and a greater current capacity is required. However, the conventional TFT is unable to comply satisfactorily with such a request.

SUMMARY OF THE INVENTION

The present invention has been made in view of such a problem and it is an object of the present invention to provide a semiconductor device. More specifically, a semiconductor device having a thin-film transistor, taking a relatively small area and having a large current capacity.

According to one aspect of the present invention, a semiconductor device comprises a semiconductor substrate and an insulating film formed on a surface of the semiconductor substrate. A gate is provided which includes a bottom branch gate extended on a surface of the insulating film. The gate further includes a plurality of branch gates branching from the bottom branch gate, extending over the bottom branch gate. A plurality of gate through-holes are provided between each of the bottom branch gates and plurality of branch gates. A channel is provided which branches from one side of the gate through-holes, and has a plurality of branch channels passing the gate through-holes. The plurality of branch channels are unified on the other side of the gate through-holes. A gate insulating film is formed between the gate and the channel. Further, each source/drain region is formed so as to be connected to the channel on the opposite sides of the gate through-holes.

According to another aspect of the present invention, a semiconductor device comprises a semiconductor substrate and an insulating film formed on a surface of the semiconductor substrate. A gate is provided which includes a bottom branch gate formed on a surface of the insulating film so as to form a tunnel on the insulating film. The gate further includes at least one other branch gate branching from end extending over the bottom branch gate. At least one gate through-hole is provided between each of the bottom branch gate end the other branch gates. A channel is provided which includes a bottom branch channel branching from one side of the gate through-hole and passing the tunnel. The channel further includes at least one other branch channel passing the gate through-holes. The bottom branch channel and the other branch channels are united on the other side of the gate through-holes. Further, each source/drain region is connected to the channel on the opposite sides of the gate through-holes.

According to another aspect of the present invention, a semiconductor device comprises a semiconductor substrate and an insulating film formed on a surface of the semiconductor substrate. A gate is provided which includes a bottom branch channel formed on a surface of the insulating film. The channel further includes a plurality of other branch channels branching from and extending over the bottom branch charnel. A plurality of channel through-holes are provided between each of the bottom branch channel and the other branch charnels. Each source/drain region is formed so as to be connected to the channel on the opposite ends of the channel. Further, a gate is provided which includes a branching from one side of the channel through-holes and passing the channel through-holes. The plurality of branch gates are united on the other side of the channel through-holes.

In the semiconductor device, the selected branch channels other than the uppermost branch channel may be divided into a plurality of sections with gaps therebetween, and the branch gates extend in the gaps.

In the semiconductor device, the channel and/or the gate are preferably composed of a single-Layer conductive film respectively.

In the semiconductor device, the channel and/or the gate are preferably composed of polysilicon film respectively.

Further, in the semiconductor device, the branch channels and the branch gates are preferably formed so as to extend perpendicularly to each other in a three-dimensional way.

Other and further objects, features and advantages of the invention will appear more fully from the following 5 description.

BRIEF DESCRIPTION OF THE DRAWINGS

Semiconductor devices in preferred embodiments according to the present invention and methods of fabricating the same will be described hereinafter with reference to the accompanying drawings, in which like or corresponding parts are designated by the same reference characters.

A preferred form of the present invention is illustrated in the accompanying drawings in which:

FIG. 1 is a perspective view of a thin-film transistor. FIGS. 2 and 3 are sectional views.

FIG. 10 is a perspective view of a thin-film transistor. FIGS. 11 and 12 are sectional views.

FIG. 18 is a perspective view of a thin-film transistor. FIGS. 19 and 20 are sectional views.

FIG. 26 is a perspective view of a thin-film transistor. FIGS. 27 and 28 are sectional views.

FIG. 35 is a perspective view of a thin-film transistor. FIGS. 36 and 37 are sectional views.

FIG. 42 is a perspective view of a thin-film transistor. FIGS. 43 and 44 are sectional views.

FIG. 49 is a perspective view of the thin-film transistor. FIGS. 50 and 51 are sectional views.

BEST MODE OF CARRYING OUT THE INVENTION

First Embodiment

Figure 1:
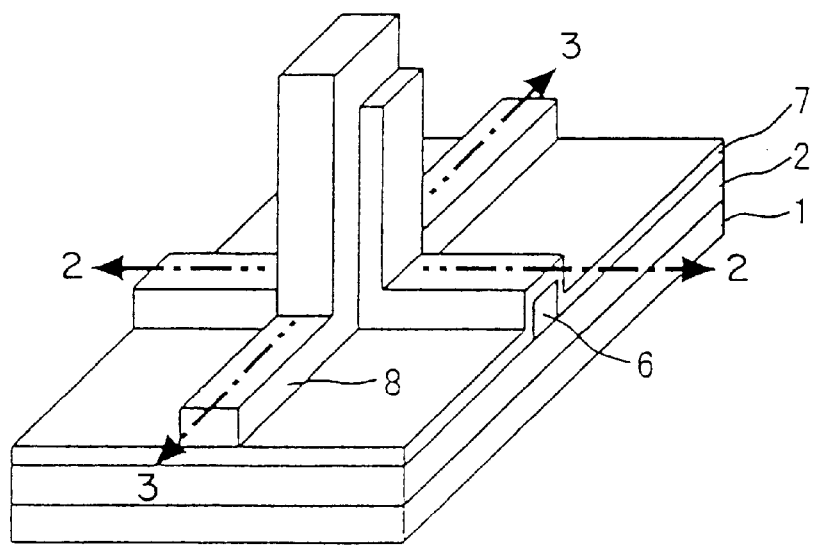
FIGS. 1 to 3 are views for explaining the structure of a semiconductor device in a first embodiment of the present invention.
Figure 2:
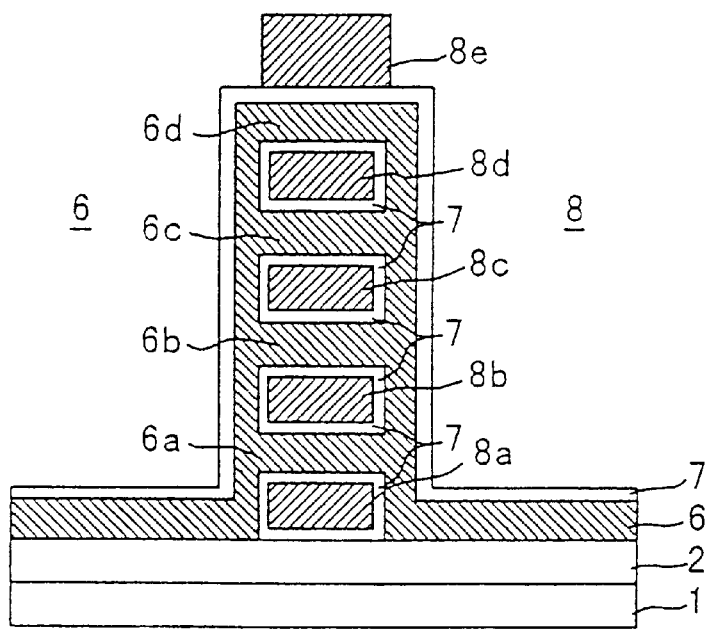
Figure 3:
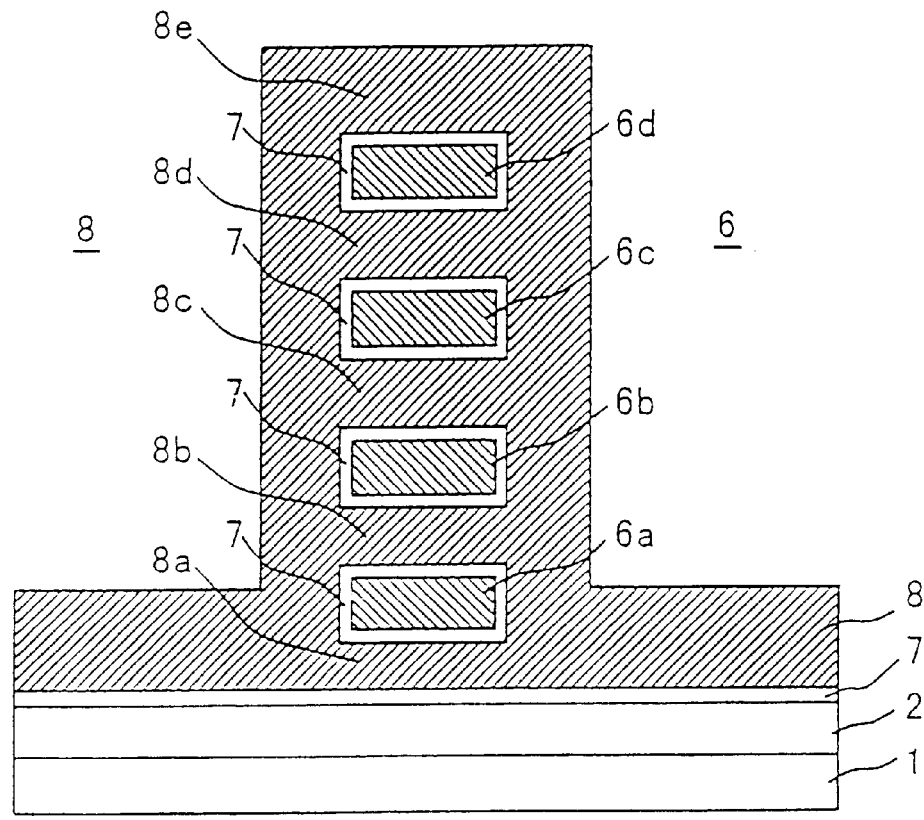

FIGS. 1 to 3 are views for explaining the structure of a semiconductor device in a first embodiment according to the present invention. FIG. 1 is a perspective view of a thin-film transistor, FIG. 2 is a sectional view taken on line A-A' in FIG. 1, and FIG. 3 is a sectional view taken on line B-B' in FIG. 1.

Shown in FIGS. 1 to 3 are a silicon substrate (semiconductor substrate) 1, a silicon dioxide film (insulating film) 2 formed on a surface of the silicon substrate land serving is a base insulating film, a channel polysilicon film 6 serving as the channel of a thin-film transistor, a silicon dioxide film (surface insulating film) 7 formed over the surface of the channel polysilicon film 6 and the surface of the silicon dioxide film 2, and a gate polysilicon film 8 serving as the gate of the thin-film transistor. The silicon dioxide film 7 between the channel polysilicon film 6 and the gate polysilicon film 8 serves as the gate oxide film of the thin-film transistor.

In this thin-film transistor, the gate 8 has a bottom branch gate 8a overlying the insulating film 2, and a plurality of branch gates 8b to 8e branching from and extending over the bottom branch gate 8a and having through holes therebetween.

The channel 6 has branch channels 6a to 6d branching from one side of the branch gates 8a to 8e, i.e., one side of the through holes of the gate 8, end passing the through holes of the gate 8. The branch channels 6a to 6d are united on the other side of the branch gates 8a to 8e, i.e., on the other side of the gate through holes.

The gate oxide film 7 is formed between the branch channels 6a to 6d and the branch gates 8a to 8e.

A source/drain region, not shown, is formed at each portion of the channel 6 on the opposite sides of the branch gates 8b to 8e, i.e., on the opposite sides of the through holes of the gate 8.

The thin-film transistor in the first embodiment thus constructed has a channel area more than four times that of a single-gate TFT taking the same area and a current capacity at least more than eight times that of the single-gate TFT.

In general a TFT is employed as a load element (i.e. load transistor) in a SRAM, and the rest of the elements of the SRAM, i.e., a driver transistor and an access transistor, are formed on the semiconductor substrate. When fabricating the SRAM employing a TFT, a driver transistor and an access transistor are first formed on a semiconductor substrate, an insulating film is formed over the driver transistor and the access transistor, a TFT is formed on the insulating film, another insulating film is formed over the TFT, and than wiring lines of aluminum or the like are formed. Therefore, the gate electrodes of the driver transistor and the access transistor underlie the TFT, and the aluminum wiring lines or the like overlie the TFT.

When the conventional SRAM is operated, the channel of the TFT is affected by electric fields created by the electrodes, which may possibly cause the characteristics of the TFT, such as threshold voltage, to vary. However, since the channel of the TFT in this embodiment is surrounded by the gates, the channel is not affected by the upper and the lower wiring lines.

Second Embodiment

FIGS. 4 to 9 are views for explaining a semiconductor device fabricating method in a second embodiment according to the present invention for fabricating the thin-film transistor explained in the first embodiment.

The semiconductor device fabricating method in the second embodiment will be described with reference to FIGS. 4 to 9 and 1 to 3.

Figure 4:
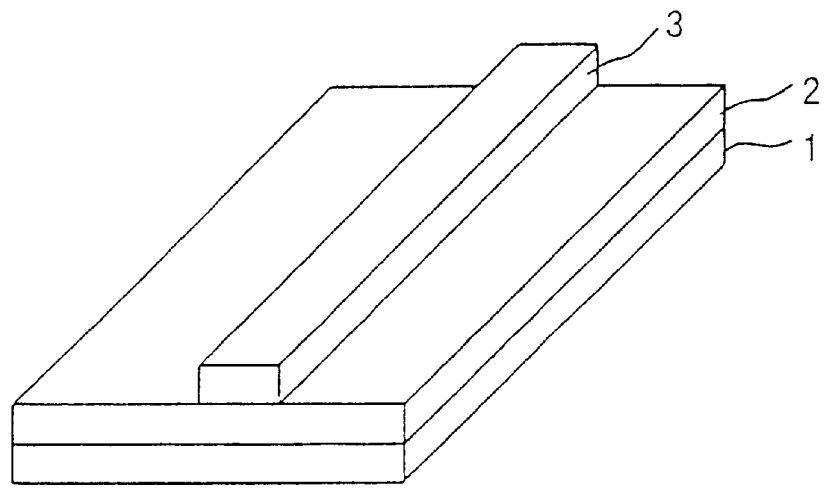
FIGS. 4 to 9 are views for explaining a semiconductor device fabricating method in a second embodiment of the present invention for fabricating the thin-film transistor shown in FIGS. 1 to 3.

Referring to FIG. 4, a silicon dioxide film 2 (base insulating film) of a predetermined thickness of, for example, about 1000 Å is formed on a surface of a silicon substrate 1 (semiconductor substrate) by, for example, a thermal oxidation process.

A silicon nitride film 3 (first dummy member) of a predetermined thickness of, for example, about 1000 Å is formed on the silicon dioxide film 2 by a reduced pressure CVD process or the like using a reaction temperature in the range of, for example, 700 to 800° C.

Subsequently, the silicon nitride film 3 is patterned in a strip of a width corresponding to that of the channel of the transistor so as to include a transistor forming position (or an element forming position).

Figure 5:
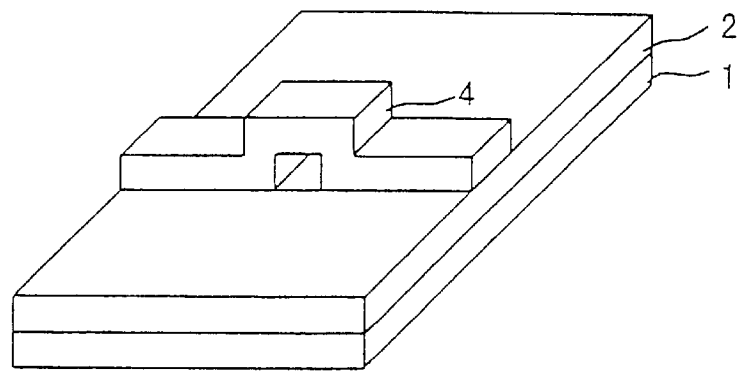

Referring to FIG. 5, a non-doped polysilicon film 4 (second dummy member) is formed in a predetermined thickness of, for example, 1000 Å over the patterned silicon nitride film 3 by a reduced pressure CVD process using a reaction temperature in the range of, for example, 400 to 700° C.

Then, the polysilicon film 4 is patterned in a desired pattern by a photolithographic etching process so as to intersect the patterned silicon nitride film 3 and to include the element forming position.

Then, the silicon nitride film is removed completely by, for example, immersing the workpiece in a hot phosphoric acid solution of 150° C. Consequently, an opening is formed in the polysilicon film 4.

Figure 6:
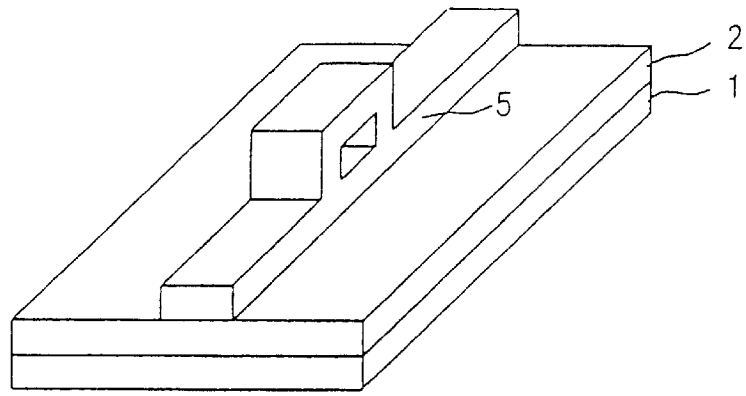

Referring to FIG. 6, a silicon nitride film 5 (third dummy member) is deposited by a reduced pressure CVD process using a reaction temperature in the range of, for example, 700 to 800° C., and the silicon nitride film 5 is patterned in a desired pattern by a photolithographic etching process.

Then, the polysilicon film 4 is removed completely by, for example, an isotropic etching process. Consequently, an opening is formed in the silicon nitride film 5.

Figure 7:
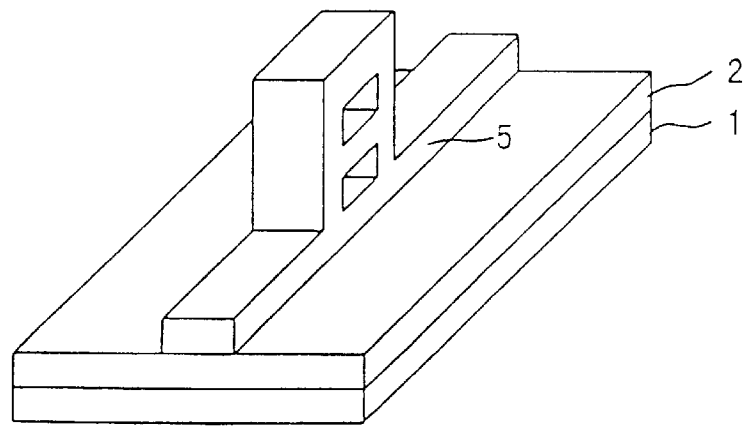
Figure 8:
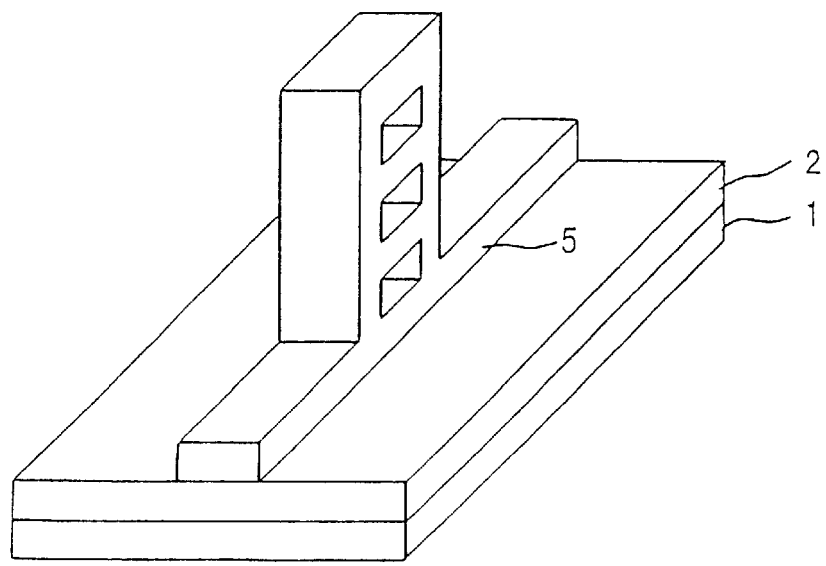

The processes illustrated in FIGS. 4 to 6 are repeated to form two openings in the silicon nitride film 5, as shown in FIG. 7. The processes illustrated in FIGS. 4 to 6 are repeated once again to form three openings in the silicon nitride film 5, as shown in FIG. 8. For example, a plurality of openings are formed in the silicon nitride film 5 by further repeating the processes illustrated in FIGS. 4 to 6.

Polysilicon not containing any impurity is deposited over the final silicon nitride film 5 (final dummy member) with the plurality of openings. A reduced pressure CVD process or the like is used to form a channel polysilicon film 6 (channel conductive film) of a thickness of 400 Å, having a reaction temperature in the range of, for example, 400 to 700° C.

Figure 9:
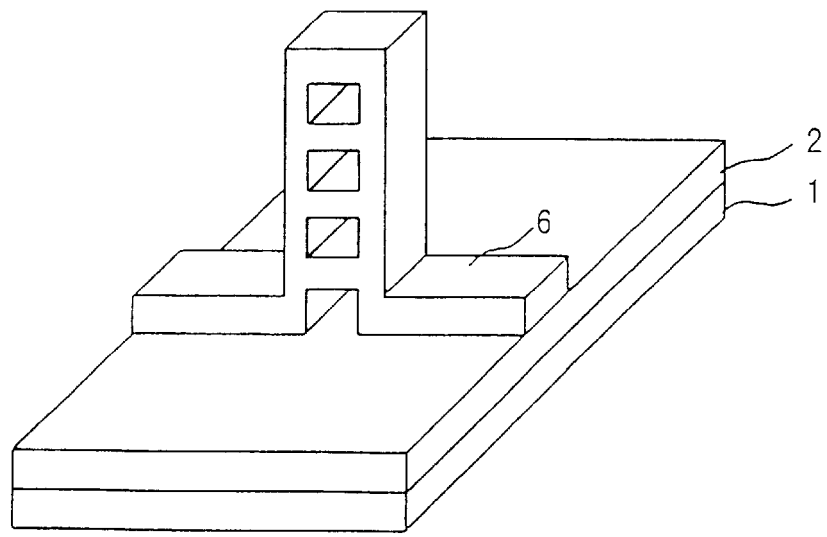

Referring to FIG. 9, the polysilicon film 6 is patterned in a desired pattern by a photolithographic etching process so as to intersect the final silicon nitride film 5 and to include the element forming position.

Subsequently, the silicon nitride film 5 is remove completely by, for example, immersing the workpiece in a hot phosphoric acid solution of 150° C. Since silicon dioxide films are not corroded by the phosphoric acid solution, the silicon dioxide film 2 remains intact. Thus, four openings are formed in the channel silicon film 6.

Referring to FIGS. 1 to 3, a gate silicon dioxide film 7 (surface insulating film) of a predetermined thickness of, for example, 200 Å as a gate insulating film is formed over the entire surface of the workpiece by a reduced pressure CVD process. During the process, a reaction temperature in the range of, for example, 600 to 700° C., is used so that the base silicon dioxide film 2 and the channel silicon film 6 are covered entirely with the gate silicon dioxide film 7.

A phosphorus-doped gate polysilicon film 9 (i.e. a doped polysilicon film) (gate conductive film) of a thickness of about 1000 Å is formed over the entire surface of the workpiece by a reduced pressure CVD using SiH4 gas containing PH3 at a reaction temperature in the range of, for example, 500 to 700° C. Since the film deposited by the reduced pressure CVD process has excellent coverage, the openings formed in the channel silicon film 5 are filled up with the gate polysilicon film 8.

The gate polysilicon film is patterned in a desired pattern so as to intersect the channel silicon film 6 and to include the element forming position by a photolithographic etching process to form a gate electrode 8 (see FIG. 1).

Although not shown, the opposite ends of the channel silicon film are subjected to source/drain implantation using the gate electrode 8 superposed on the channel silicon film 6. Then, a layer insulating oxide film is formed, and wiring lines of aluminum or the like are extended from the gate electrode and the source/drain region to complete a desired transistor.

The thin-film transistor in the second embodiment constructed has a channel area more than four times that of a single-gate TFT, taking the same area and a current capacity at least more than four times that of the single-gate TFT. The thin-film transistor illustrated and described above has a current capacity at least more than eight times that of the single-gate TFT.

Since the channel of the TFT in this embodiment is surrounded by the gates, the channel is not affected by the upper and the lower wiring lines, and the characteristics of the TFT are not subject to variation.

In the second embodiment, the channel and the gate can be formed by processing a single conductive film by a single process respectively.

Finally, the method of fabricating a semiconductor device according to this second embodiment may be summarized as follows.

First, a strip-shaped first dummy member is formed in a region including an element forming position on a base insulating film on a semiconductor substrate (a first step). Then, a strip-shaped second dummy member is formed so as to intersect the first dummy member at the element forming position, and the first dummy member is removed (a second step). A strip-shaped third dummy member is formed so as to intersect the second dummy member at the element forming position, removing the second dummy member (a third step). The first to third steps are repeated by a predetermined number of times to form dummy members over the third dummy members. A strip-shaped channel conductive film for a channel is formed so as to intersect the last dummy member at the element forming position, and the last dummy member is removed. A surface insulating film is formed over the entire surface of the channel conductive film. A strip-shaped gate conductive film for a gate is formed so as to intersect the channel conductive film coated with the surface 5 insulating film at the element forming position.

In the method, each of the channel conductive films and/or the gate conductive films are formed preferably by a single-layer conductive film, respectively. Further, the channel conductive film and/or the gate conductive film are formed preferably by polysilicon film, respectively. Further, the first and the third dummy member are formed preferably by silicon nitride films, and the second dummy member is formed preferably by a polysilicon film. Still further, the channel conductive film and the gate conductive film are formed so as to extend perpendicularly to each other in a three-dimensional way.

Third Embodiment

Figure 10:
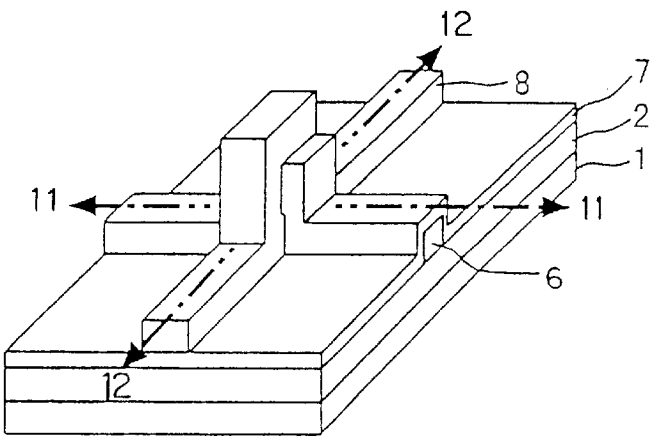
FIGS. 10 to 12 are views for explaining the structure of a semiconductor device in a third embodiment of the present invention.
Figure 11:
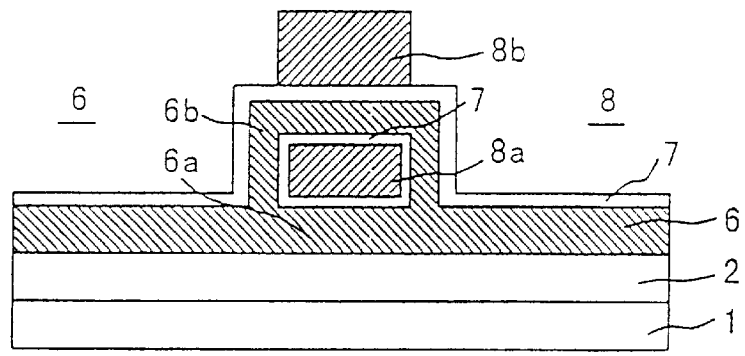
Figure 12:
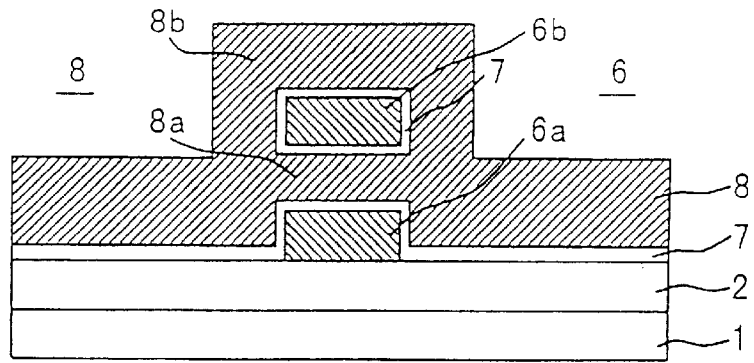

FIGS. 10 to 12 are exemplary diagrams of the structure of a semiconductor device in a third embodiment according to the present invention.

FIG. 10 is a perspective view of a thin-film transistor, FIG. 11 is a sectional view taken on lines A-A' in FIG. 10, FIG. 12 is a sectional view taken on line B-B' in FIG. 10.

In the thin-film transistor shown in FIGS. 10 to 12, a gate 8 has a bottom branch gate 8a formed on the surface of an insulating film 2 to partially form a tunnel between the insulating film 2 and the bottom branch gate 8a, and a branch gate 8b branching from and extending over the bottom branch gate 8a to form a through hole therebetween, and connected to the bottom branch gate 8a via the through hole.

A channel 6 has a branch channel 6a branching from one side of the branch gates 8a and 8b, i.e., from one side of the through hole of the gate 8, and passing the tunnel of the gate 8, and a branch channel 6b passing the through hole. The branch channels 6a and 6b are united on the other side of the branch gate 8a or 8b, i.e., on the side of the other end of the through hole of the gate 8.

The branch channels 6a and 6b are separated from the branch gates 8a and 8b by a gate oxide film 7.

A source/drain region, not shown, is formed so as to be connected to the channel 6, respectively, on the sides of the branch gates 8a and 8b, i.e., on the opposite sides of the through hole of the gate 8.

The thin-film transistor in the third embodiment constructed has a channel area three times that of a single-gate TFT, taking the same area and a current capacity at least three times that of the single-gate TFT.

Since the gate overlies the channel of the TFT in this embodiment, the channel is not affected by the upper wiring lines, and the characteristics of the TFT are not subject to variation.

Fourth Embodiment

FIGS. 13 to 17 are exemplary diagrams of a semiconductor device fabricating method in a fourth embodiment according to the present invention for fabricating the thin-film transistor shown in the third embodiment.

The semiconductor device fabricating method in the fourth embodiment will be described with reference to FIGS. 10 to 12 and 13 to 17.

Figure 13:
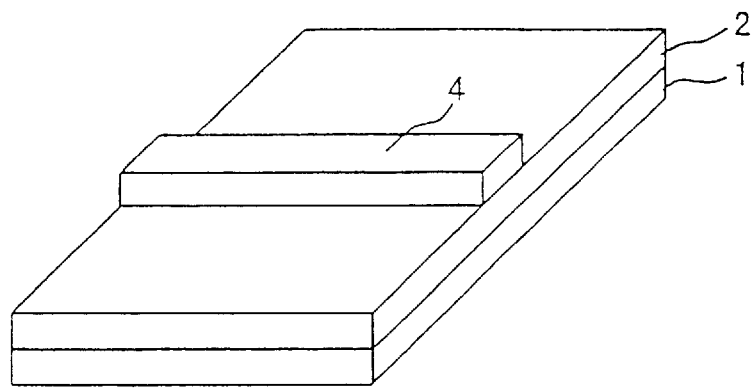
FIGS. 13 to 17 are views for explaining a semiconductor device fabricating method in a fourth embodiment of the present invention for fabricating the thin-film transistor shown in FIGS. 10 to 12.

Referring to FIG. 13, a silicon dioxide film 2 (base insulating film) of a predetermined thickness of, for example, about 1000 Å is formed on a surface of a silicon substrate 1 by, for example, a thermal oxidation process.

A polysilicon film 4 (second dummy member) of a predetermined thickness of, for example, about 1000 Å is deposited by a reduced pressure CVD process or the like using a reaction temperature in the range of, for example, 400 to 700° C. (The fourth embodiment does not have any member corresponding to the first dummy member 3 of the second embodiment.)

Subsequently, the polysilicon film 4 is patterned in a strip of a width corresponding to that of the channel of the transistor.

Figure 14:
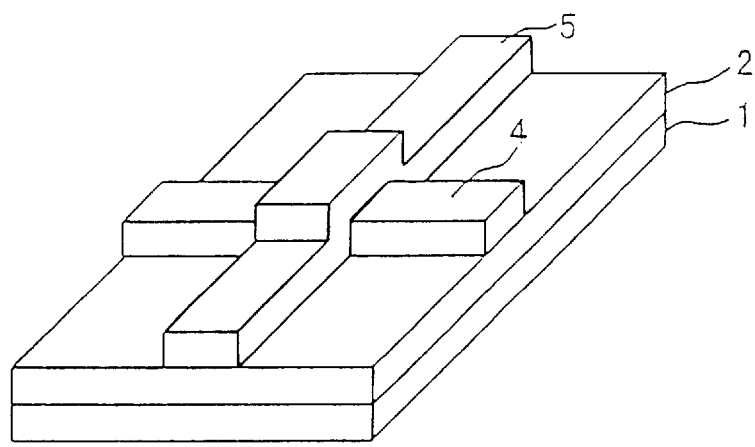

Referring to FIG. 14, a silicon nitride film 5 (third dummy member) is deposited by a reduced pressure CVD process using a reaction temperature in the range of, for example, 700 to 800° C., and then the silicon nitride film is patterned in a desired pattern by a photolithographic etching process.

Figure 15:
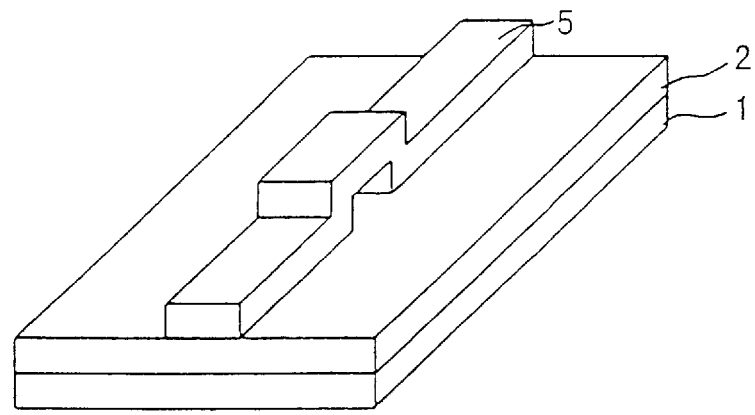

Referring to FIG. 15, the polysilicon film 4 is removed by, for example, an isotropic polysilicon etching process. Consequently, an opening is formed under the silicon nitride film 5.

Figure 16:
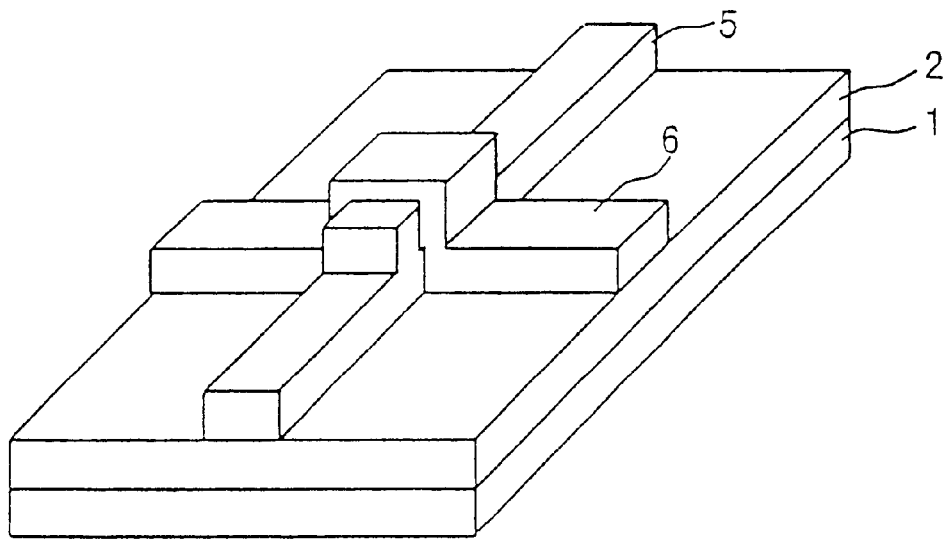

Referring to FIG. 16, non-doped polysilicon is deposited over the silicon nitride film 5 to form a channel silicon film 6 of a thickness of, for example, 400 Å by a reduced pressure CVD process or the like using a reaction temperature in the range of, for example, 400 to 700° C. Then, the channel silicon film 6 is patterned in a desired pattern by a photolithographic etching process.

Figure 17:
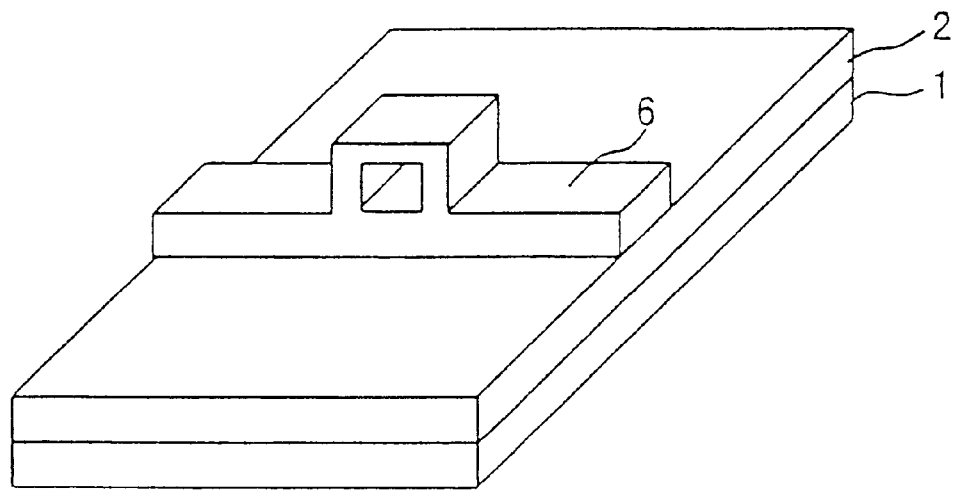

Subsequently, the silicon nitride film 5 is removed completely as shown in FIG. 17 by, for example, immersing the workpiece in a hot phosphoric acid solution of 150° C. Since silicon dioxide films are not corroded by the phosphoric acid solution, the silicon dioxide film 2 remains intact. Thus, an opening is formed in the channel silicon film 6.

A second silicon dioxide film 7 of a predetermined thickness of, for example, 200 Å, serving as a gate insulating film is formed over the entire surface of the workpiece by a reduced pressure CVD process. During the process, a reaction temperature in the range of, for example, 600 to 900° C. is used so that the first silicon dioxide film 2 and the channel silicon film 6 are covered entirely with the second silicon dioxide film 7.

Referring to FIGS. 10 to 12, a phosphorus-doped second polysilicon film 8 (i.e. doped polysilicon film) of a thickness of about 1000 Å is formed over the entire surface of the workpiece by a reduced pressure CVD using SiH4 gas containing PH3 at a reaction temperature in the range of, for example, 500 to 700° C. Since films deposited by a reduced pressure CVD process have excellent coverage, the opening formed in the channel silicon film 6 is filled up with the second polysilicon film 8.

The second polysilicon film 8 is patterned in a desired pattern by a photolithographic etching process (see FIG. 10) to form a gate electrode.

Although not shown, source/drain implantation is carried out by using the gate electrode 8 formed over the channel silicon film 6 as a mask. An interlayer insulating oxide film is formed, and wiring lines of aluminum or the like are extended from the gate electrode and the source/drain regions to complete a desired transistor.

The thin-film transistor constructed in this embodiment has a channel area three times that of a single-gate TFT, taking the same area and a current capacity at least three times that of the single-gate TFT.

The thin-film transistor illustrated and described above has a current capacity at least more than eight times that of the single-gate TFT.

Since the gate overlies the channel of the TFT in this embodiment, the channel is not affected by the upper wiring lines, and the characteristics of the TFT are not subject to variation.

In this embodiment, the channel and the gate can be formed by processing a single conductive film by a single process, respectively.

Finally, the method of fabricating a semiconductor device according to this fourth embodiment may be summarized as follows.

First, a strip-shaped second dummy member is formed in a region including an element forming position on a base insulating film on a semiconductor substrate. Then, a strip-shaped third dummy member is formed so as to intersect the second dummy member at the element forming position, and removing the second dummy member. A strip-shaped channel conductive film for a channel is formed so as to intersect the third dummy member at the element forming position, and the third dummy member is removed. A surface insulating film is formed over the entire surface of the channel conductive film. A strip-shaped gate conductive film for a gate is formed so as to intersect the channel conductive film coated with the surface insulating film at the element forming position.

Fifth Embodiment

Figure 18:
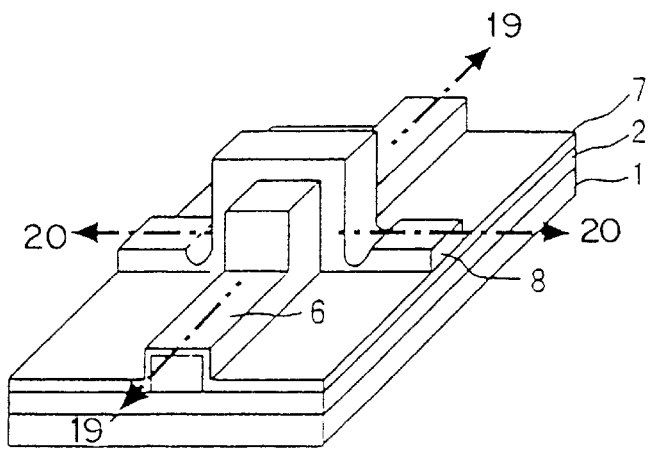
FIGS. 18 to 20 are views for explaining a semiconductor device in a fifth embodiment of the present invention.
Figure 19:
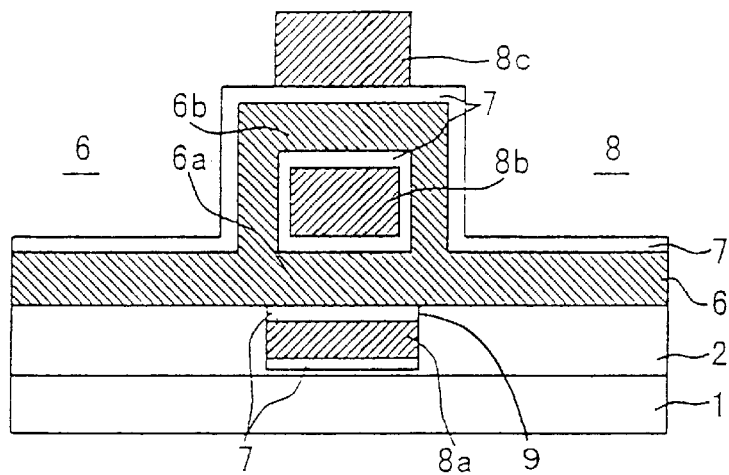
Figure 20:
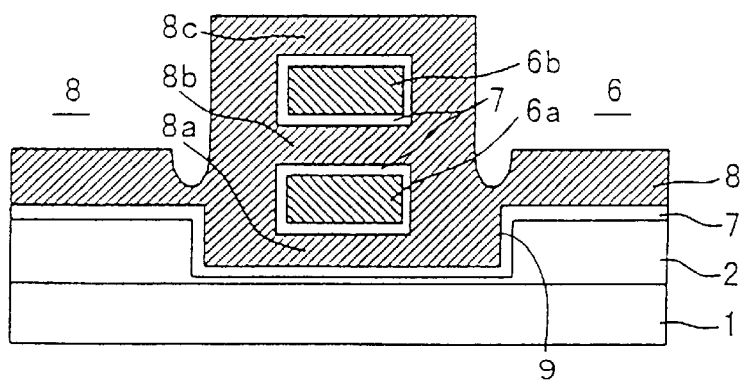

FIGS. 18 to 20 are exemplary diagrams of a semiconductor device in a fifth embodiment according to the present invention. FIG. 18 is a perspective view of a thin-film transistor, FIG. 19 is a sectional view taken on line A-A' in FIG. 18, and FIG. 20 is a sectional view taken on line B-B' in FIG. 18.

As shown in FIGS. 18 to 20, the thin-film transistor has an insulating film 2 provided at an element forming position in its surface with a recess 9.

A gate 8 has a bottom branch gate 8a formed in a portion of the surface of the insulating film 2 corresponding to the recess 9, and a plurality of branch gates 8b and 8c lying over the bottom branch gate 8a and having a through hole, respectively, therebetween.

A channel 6 has branch channels 6a and 6b branching from one side of the branch gates 8a to 8c, i.e., from one side of the through hole of the gate 8, and passing each through hole of the gate 8. The branch channels 6a and 6b are united on the other side of the branch gates 8a to 8c, i.e., the other side of the through hole.

The branch channels 6a and 6b are separated from the branch gates 8a to 8c by a gate oxide film 7.

A source/drain region (not shown) is connected to the channel 6, respectively, on the opposite sides of the branch gates 8b and 8c, i.e., on the opposite sides of the through hole.

The thin-film transistor constructed in this embodiment has a channel area four times that of a single-gate TFT, taking the same area, and a current capacity at least four times that of the single-gate TFT.

The height of steps in this embodiment is reduced by a height corresponding to the depth of the recess 9.

Since the channel of the TFT in this embodiment is surrounded by the gate, the channel is not affected by the upper and lower wiring lines, and the characteristics of the TFT are not subject to variation.

Finally, the construction of the semiconductor device according to this fifth embodiment may be summarized as follows.

The semiconductor device comprises a semiconductor substrate provided with a recess. An insulating film is formed on a surface of the recess and on a surface of the semiconductor substrate. A gate is provided which includes a bottom branch gate formed so as to extend on the surface of the insulating film formed on the surface of the recess and on the surface of the insulating film. The gate further includes a plurality of other branch gates, branching from end extending over the bottom branch gate. A plurality of gate through-holes are provided between each of the bottom branch gate end the other branch gates. A channel is provided which includes a plurality of branch channels, branching from one side of the gate through-holes and passing the gate through-holes. The branch channels are united on the other side of the gate through-holes. Further, each of source/drain regions is formed so as to be connected to the channel on the opposite side of the gate through-holes.

Sixth Embodiment

FIGS. 21 to 25 are exemplary diagrams of a semiconductor device fabricating method in a sixth embodiment, according to the present invention, for fabricating the thin-film transistor shown in the fifth embodiment.

The semiconductor device fabricating method in the sixth embodiment will be described with reference to FIGS. 18 to 20 and 21 to 25.

Figure 21:
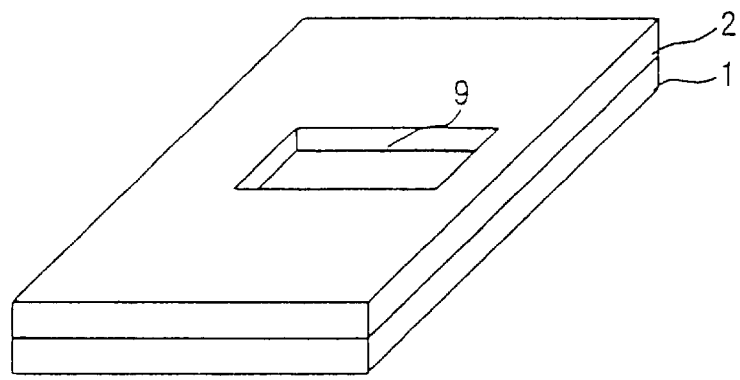
FIGS. 21 to 25 are views for explaining a semiconductor device fabricating method in a sixth embodiment of the present invention for fabricating the thin-film transistor shown in FIGS. 18 to 20.

Referring to FIG. 21, a silicon dioxide film 2 of a predetermined thickness of, for example, about 1000 Å is formed on a surface of a silicon substrate 1 by, for example, a thermal oxidation process.

A resist mask of a desired pattern is formed by a photolithographic process, and part of the silicon dioxide film 2 is removed by an anisotropic dry etching process to form a recess 9 of a predetermined size (see FIG. 21). When forming the recess 9 by the anisotropic dry etching process, a portion of the silicon dioxide film 2 corresponding to the recess 9 may be completely removed. Thus, a portion of the surface of the silicon substrate corresponding to the recess 9 is exposed, or some part of the portion of the silicon dioxide film 2 corresponding to the recess 9 may be left unremoved. Hence, the portion of the surface of the silicon substrate may not be exposed, provided that the recess is formed in a predetermined depth of, for example, about 500 Å. The size (or area) of the recess 9 is slightly greater than the size (L and W) of the channel of the thin-film transistor to be fabricated.

Figure 22:
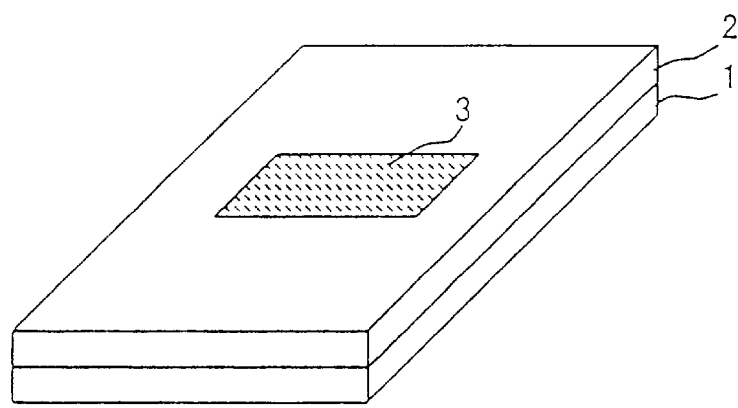
Figure 23:
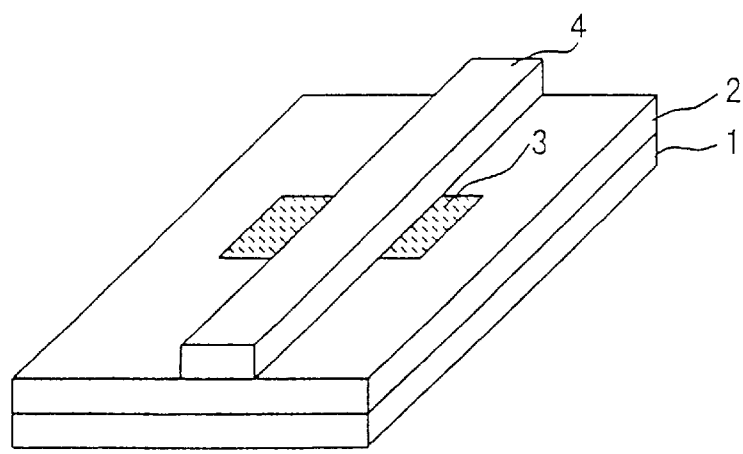

Referring to FIG. 22, silicon nitride is deposited so as to fill up the recess 9 by a reduced pressure CVD process at a reaction temperature in the range of, for example, 400 to 700° C. to form a silicon nitride film 3 (first dummy member). The silicon nitride film 3 is etched back by anisotropic dry etching to remove the silicon nitride film 3 gradually, and etching is stopped when the surface of the oxide film 2 is exposed. Thus, the silicon nitride film 3 is formed only in the recess 9 and the surface of the workpiece becomes flat.

A non-doped polysilicon film 4 (second dummy member) of a predetermined thickness of, for example, 1000 Å is deposited by a reduced pressure CVD process or the like using a reaction temperature in the range of, for example, 400 to 700° C.

Subsequently, the polysilicon film 4 is patterned in a desired pattern by a photolithographic etching process.

Figure 24:
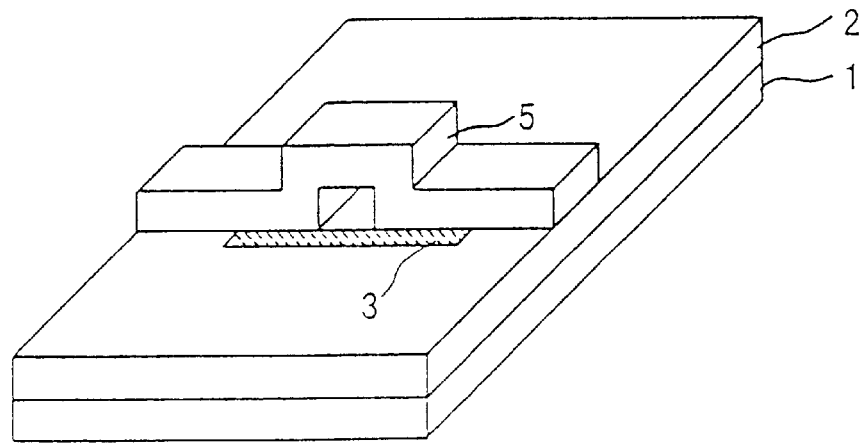

Referring to FIG. 24, a silicon nitride film 5 (third dummy member) of a predetermined thickness of, for example about 1000 Å is deposited by a reduced pressure CVD process using a reaction temperature in the range of, for example, 400 to 700° C., and then the silicon nitride film 5 is patterned in a desired pattern by a photolithographic etching process.

Then, the polysilicon film 4 is removed completely by, for example, an isotropic polysilicon etching process. Consequently, an opening is formed in a structure consisting of the silicon nitride film 3 and the silicon nitride film 5.

Figure 25:
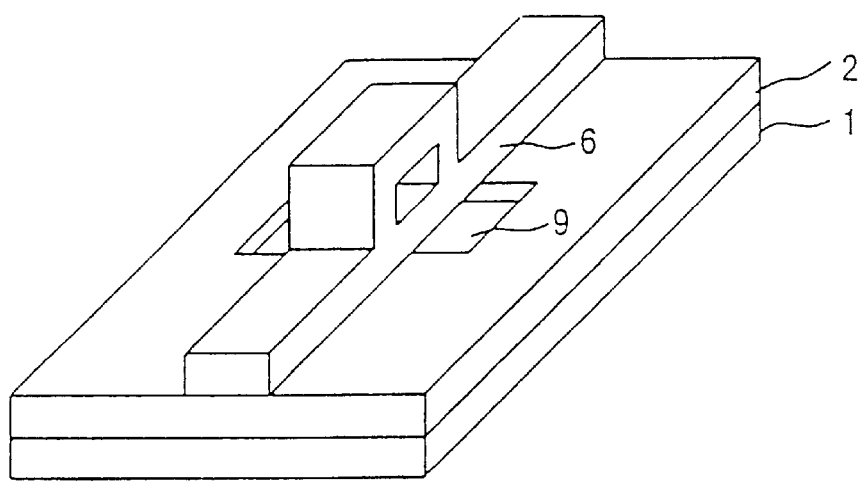

Referring to FIG. 25, non-doped polysilicon is deposited over the silicon nitride film 5 to form a channel silicon film 6 of a thickness of, for example, 400 Å by a reduced pressure CVD process or the like using a reaction temperature in the range of, for example, 400 to 700° C. Then, the channel silicon film 6 is patterned in a desired pattern by a photolithographic etching process.

Subsequently, the silicon nitride films 3 and 5 are removed completely by, for example, immersing the workpiece in a hot phosphoric acid solution of 150° C. Since silicon dioxide films are not corroded by the phosphoric acid solution, the silicon dioxide film 2 remains intact. Thus, an opening is formed in the channel silicon film 6.

Referring to FIGS. 18 to 20, a silicon dioxide film 7 of a predetermined thickness of, for example, 200 Å serving as a gate insulating film is formed over the entire surface of the workpiece by a reduced pressure CVD process using a reaction temperature in the range of, for example, 600 to 900° C. Thus the silicon dioxide film 2 and the channel silicon film 6 are covered entirely with the silicon dioxide film 7.

Subsequently, a gate polysilicon film 8 (i.e. doped polysilicon film) of a thickness of about 1000 Å is formed over the entire surface of the workpiece by a reduced pressure CVD using SiH4 gas containing PH3 at a reaction temperature in the range of, for example, 500 to 700° C. Since films deposited by a reduced pressure CVD process have excellent coverage, the opening formed in the channel silicon film 6 is filled up with the gate polysilicon film 8. The gate polysilicon film 8 is patterned in a desired pattern by a photolithographic etching process (see FIG. 18) to form a gate electrode 8.

Although not shown, source/drain implantation is carried out by using the gate electrode 8 formed over the channel silicon film 6 as a mask. A layer insulating oxide film is formed, and wiring lines of aluminum or the like are extended from the gate electrode and the source/drain region to complete a desired transistor.

The thin-film transistor constructed in this embodiment has a channel area four times that of a single-gate TFT, taking the same area, and a current capacity at least four times that of the single-gate TFT.

In this embodiment, the height of the steps is reduced by a height corresponding to the depth of the recess 9 formed in the silicon dioxide film 2.

Since the channel of the TFT in this embodiment is surrounded by the gate, the channel is not affected by the upper and lower wiring lines, and the characteristics of the TFT are not subject to variation.

In this embodiment, the channel and the gate can be formed by processing a single conductive film by a single process, respectively.

Finally, the method of fabricating a semiconductor device according to this sixth summarized as follows.

First, a recess is formed in a semiconductor substrate at an element forming position. Then, a base insulating film is formed to cover a surface of the recess and a surface of a semiconductor substrate. The recess is filled up with a first dummy member. A strip-shaped second dummy member is formed so as to extend over the first dummy member filling up the recess, and also the surface of the semiconductor substrate coated with the base insulating film. A strip-shaped third dummy member is formed so as to intersect the second dummy member at the element forming position. A strip-shaped channel conductive film for a channel is formed so as to intersect the third dummy member at the element forming position, removing the third and the first dummy member. A surface insulating film is formed on the surface of the channel conductive film. A strip-shaped gate conductive film for a gate is formed so as to intersect the channel conductive film coated with the surface insulating film at the element forming position.

Seventh Embodiment

Figure 26:
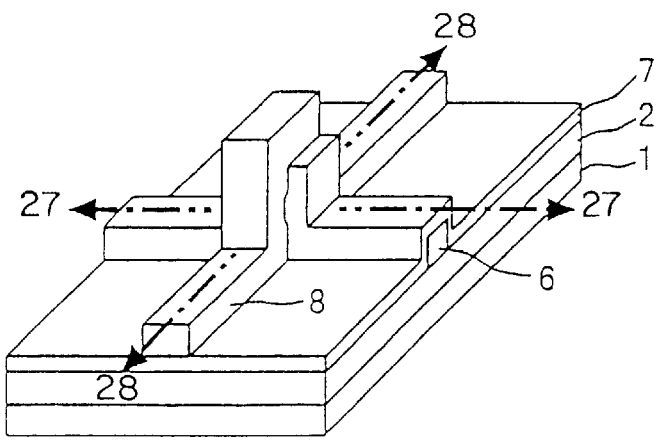
FIGS. 26 to 28 are views for explaining a structure of a semiconductor device in a seventh embodiment of the present invention.
Figure 27:
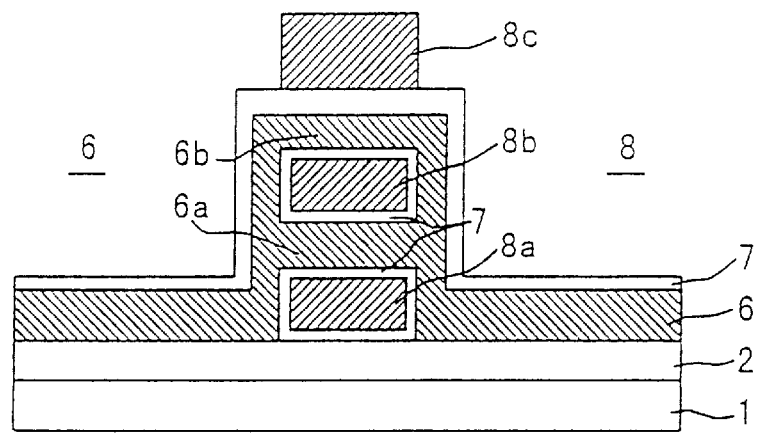
Figure 28:
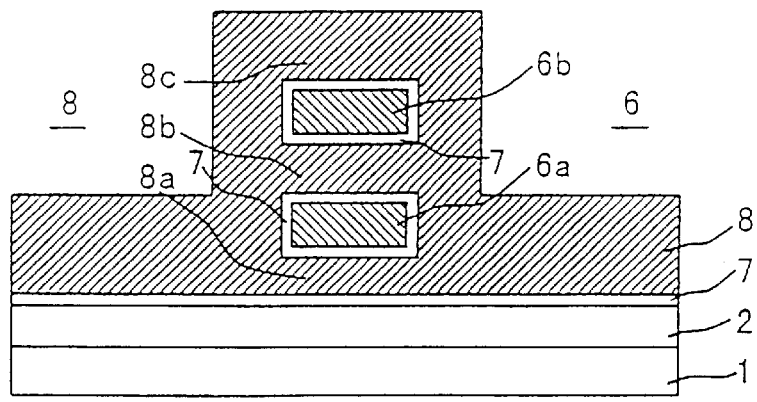

FIGS. 26 to 28 are exemplary diagrams of a structure of a semiconductor device in a seventh embodiment according to the present invention. FIG. 26 is a perspective view of a thin-film transistor, FIG. 27 is a sectional view taken on line A-A' in FIG. 26, and FIG. 28 is a sectional view taken on line B-B' in FIG. 26.

As shown in FIGS. 26 to 28, a gate 8 has a bottom branch gate 8a formed on the surface of an insulating film 2. The gate 8 also has a plurality of branch gates 8b and 8c branching from and lying over the bottom branch gate 8a, having a through hole respectively therebetween.

A channel 6 has branch channels 6a and 6b branching from one side of the branch gates 8a to 8c, i.e., from one side of the through hole of the gate 8, and passing each through hole of the gate 8. The branch channels 6a and 6b are united on the other side of the branch gates 8a to 8c, i.e., the other side of the through hole.

The branch channels 6a and 6b are separated from the branch gates 8a to 8c by a gate oxide film 7.

A source/drain region (not shown) is connected to the channel 6, respectively, on the opposite sides of the branch gates 8a and 8c, i.e., on the opposite sides of the through hole.

Although the thin-film transistor in the seventh embodiment differs from the thin-film transistor in the first embodiment in the number of branch gates and the number of branch channels, the thin-film transistors in the first end the seventh embodiment are based on the same structural conception.

The thin-film transistor constructed in this embodiment has a channel area four times that of a single-gate TFT, taking the same area, and a current capacity at least four times that of the single-gate TFT.

Since the channel of the TFT in this embodiment is surrounded by the gate, the channel is not affected by the upper and lower wiring lines, and the characteristics of the TFT are not subject to variation.

Eighth Embodiment

FIGS. 29 to 34 are exemplary diagrams of a semiconductor device fabricating method in an eighth embodiment, according to the present invention, for fabricating the thin-film transistor shown in the seventh embodiment.

The semiconductor device fabricating method in this embodiment will be described with reference to FIGS. 26 to 28 and FIGS. 29 to 34.

Figure 29:
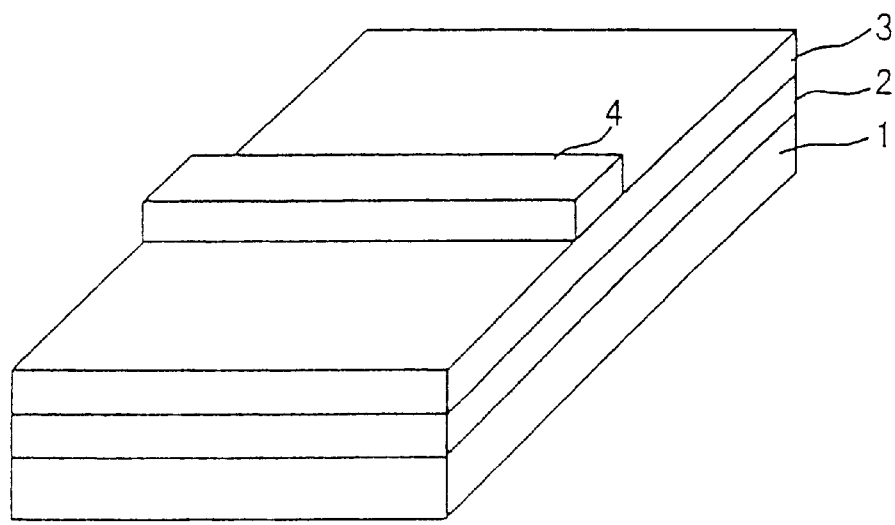
FIGS. 29 to 34 are views for explaining a semiconductor device fabricating method in an eighth embodiment of the present invention for fabricating the thin-film transistor shown in FIGS. 26 to 28.

Referring to FIG. 29, a silicon dioxide film 2 (base insulating film) of a predetermined thickness of, for example, about 1000 Å is formed on a surface of a silicon substrate 1 (semiconductor substrate) by, for example, a thermal oxidation process.

A silicon nitride film 3 (first dummy member) of a predetermined thickness of, for example, about 1000 Å is formed on the silicon dioxide film 2 by a reduced pressure CVD process using a reaction temperature in the range of, for example, 400 to 700° C.

A polysilicon film 4 (second dummy member) of a predetermined thickness of, for example, about 1000 Å is formed by a reduced pressure CVD process using a reaction temperature in the range of, for example, 600 to 900° C.

Then, the polysilicon film 4 is patterned in a desired pattern by a photolithographic etching process.

Figure 30:
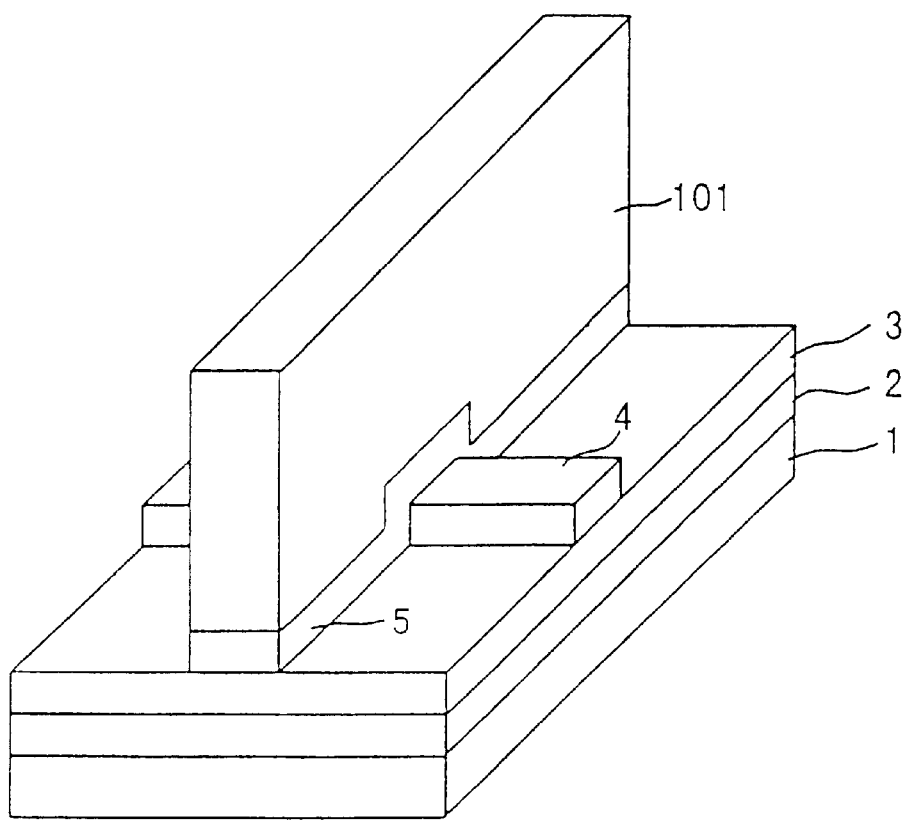

Referring to FIG. 30, a silicon nitride film 5 (third dummy member) is formed in a predetermined thickness of, for example, 1000 Å by a reduced pressure CVD process using a reaction temperature in the range of, for example, 400 to 700° C. Then, the silicon nitride film 5 is patterned in a desired pattern by a photolithographic etching process using a resist mask 101.

Figure 31:
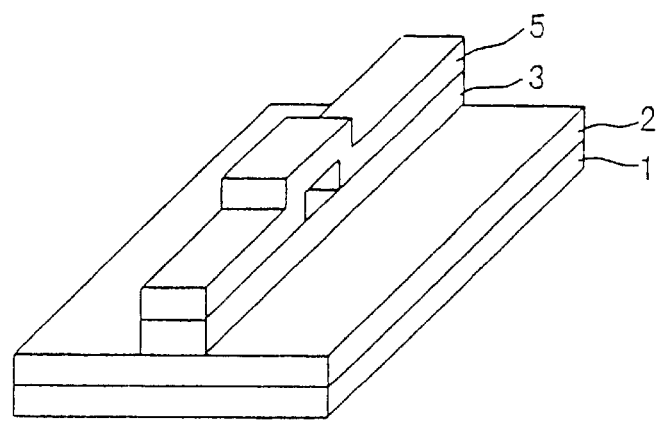

Referring to FIGS. 30 and 31, in a state in which the resist mask 101 exists, the polysilicon film 4 is removed completely by, for example, an isotropic etching process.

Referring to FIGS. 30 and 31, in a state in which the resist mask 101 exists, the silicon nitride film 3 is patterned in a desired pattern by an anisotropic etching process. Consequently, an opening is formed in a structure consisting of the first silicon nitride film 3 and the silicon nitride film 5.

Figure 32:
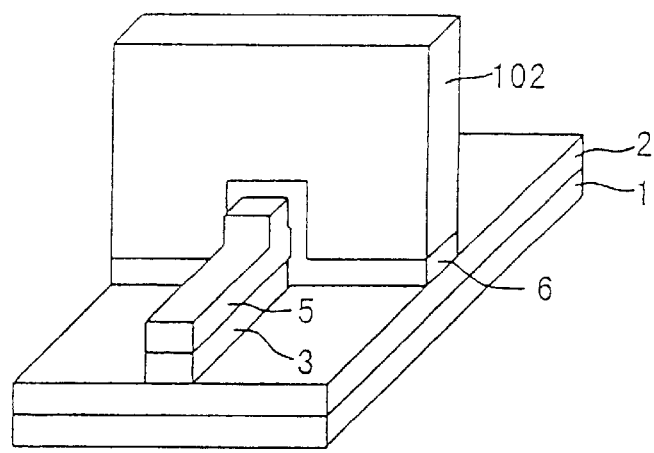

Referring to FIG. 32, non-doped polysilicon is deposited in a predetermined thickness of, for example, 400 Å over the surface of the workpiece by, for example, a reduced pressure CVD process using a reaction temperature in the range of, for example, 400 to 700° C. to form a channel silicon film 6. The channel silicon film 6 is patterned in a desired pattern by a photolithographic etching process using a resist mask 102.

Figure 33:
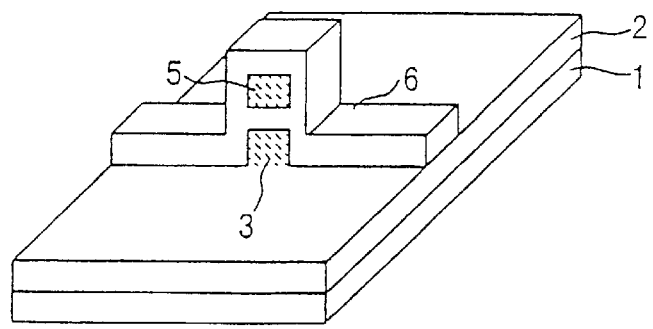

Referring to FIGS. 32 and 33, in a state in which a resist mask 102 exists, the silicon nitride films 3 and 5 are etched by anisotropic etching to remove the silicon nitride films, other than portions thereof. Hence, the openings of the channel silicon film 6 are filled up and then the resist mask 102 is removed (see FIG. 33).

Figure 34:
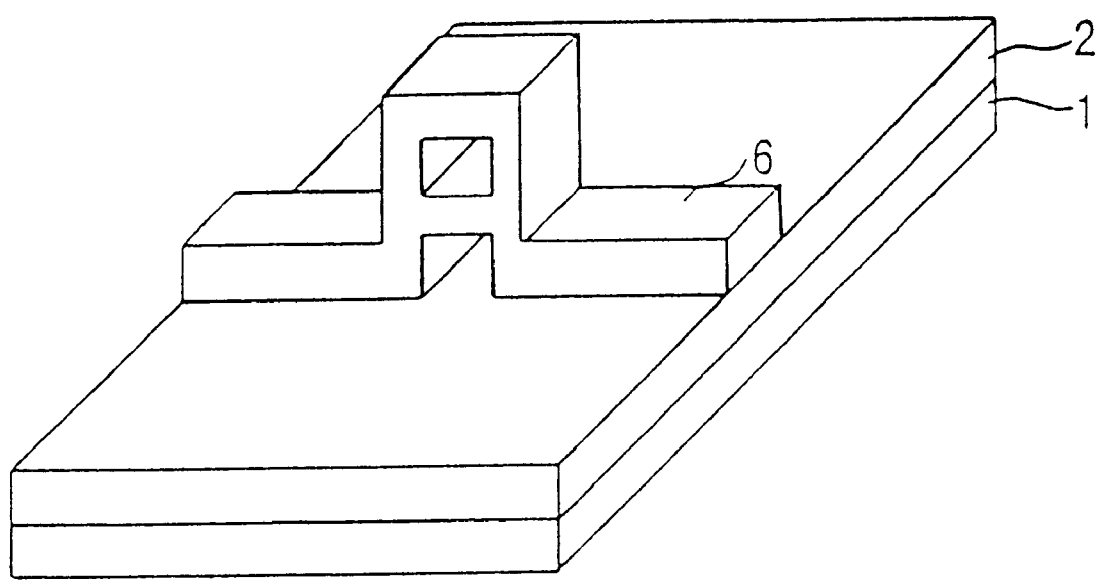

Referring to FIG. 34, the silicon nitride films are removed completely by, for example, immersing the workpiece in a hot phosphoric acid solution of 150° C. Since silicon dioxide films are not corroded by the phosphoric acid solution, the silicon dioxide film 2 remains intact. Thus, an opening is formed in the channel silicon film 6.

Referring to FIGS. 26 to 28, a gate silicon dioxide film 7 of a predetermined thickness of, for example, 200 Å is deposited so as to entirely cover the silicon dioxide film 2 and the channel silicon film 6. A reduced pressure CVD process is used with a reaction temperature in the range of, for example, 600 to 900° C.

Subsequently, a gate polysilicon film 8 (i.e. a doped polysilicon film) of a thickness of, for example, about 1000 Å is formed over the entire surface of the workpiece by a reduced pressure CVD using SiH4 gas containing PH3 at a reaction temperature in the range of, for example, 500 to 700° C. Since films deposited by a reduced pressure CVD process have excellent coverage, the opening formed in the channel silicon film 6 is filled up with the gate polysilicon film 8.

The gate polysilicon film 8 is patterned in a desired pattern by a photolithographic etching process to form a gate electrode 8 (see FIG. 26).

Although not shown, source/drain implantation is carried out by using the gate electrode 8 formed over the channel silicon film 6 as a mask. An interlayer insulating oxide film is formed, and wiring lines of aluminum or the like are extended from the gate electrode and the source/drain region to complete a desired transistor.

The thin-film transistor constructed in this embodiment has a channel area four times that of a single-gate, TFT taking the same area and a current capacity at least four times that of the single-gate TFT.

Since time for removing the nitride film by using a hot phosphoric acid solution can be reduced, damage to the channel silicon film exerted by the hot phosphoric acid solution can be reduced.

Since the TFT channel is surrounded by the gate, the channel is not affected by the upper and lower wiring lines, and the characteristics of the TFT are not subject to variation.

In this embodiment, the channel and the gate can be formed by processing a single conductive film by a single process, respectively.

Finally, the method of fabricating a semiconductor device according to this eighth embodiment may be summarized as follows.

First, a first dummy member is formed on a surface of a base insulating film formed on a surface of a semiconductor substrate. Then, a strip-shaped second dummy member is formed in a region including an element forming position on a semiconductor substrate on which the first dummy member is formed. A strip-shaped third dummy member coated with a resist mask is formed so as to intersect the second dummy member at the element forming position. The second dummy member is removed through the resist mask, and the first dummy member is patterned along the third dummy member. A strip-shaped channel conductive film for a channel coated with a resist mask is formed so as to intersect the third dummy member at the element forming position. The third dummy member and the patterned first dummy member are patterned by anisotropic etching by using the resist mask. A portion of the third dummy member covered with the channel conductive film and remaining after anisotropic etching is removed, and the first dummy member is removed. A surface insulating film is formed over the entire surface of the channel conductive film. A strip-shaped gate conductive film for a gate is formed so as to intersect the channel conductive film coated with the surface insulating film at the element forming position.

Ninth Embodiment

Figure 35:
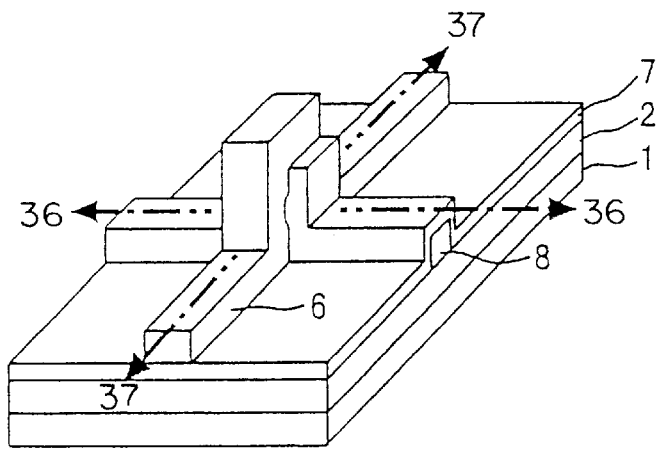
FIGS. 35 to 37 are views for explaining a structure of a semiconductor device in a ninth embodiment of the present invention.
Figure 36:
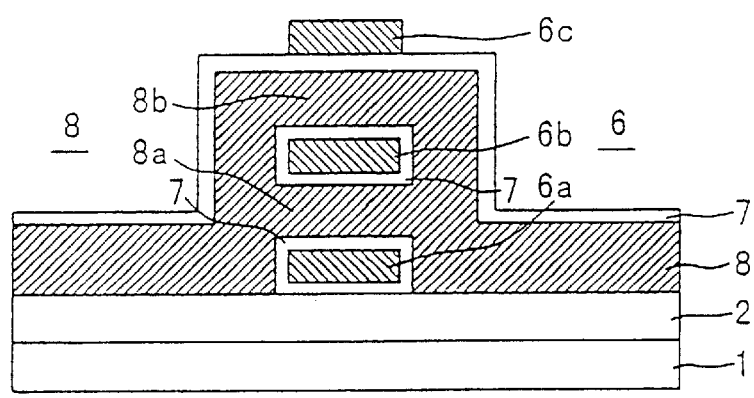
Figure 37:
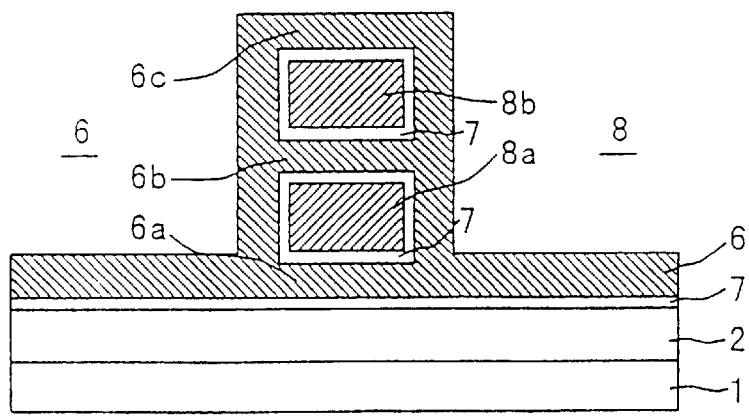

FIGS. 35 to 37 are exemplary diagrams of a structure of a semiconductor device in a ninth embodiment according to the present invention. FIG. 35 is a perspective view of a thin-film transistor, FIG. 36 is a sectional view taken on line A-A' in FIG. 35, and FIG. 37 is a sectional view taken on line B-B' in FIG. 35.

As shown in FIGS. 35 to 37, a channel 6 included in this thin-film transistor has a bottom branch channel 6a lying on the surface of an insulating film 2, and a plurality of branch channels 6b and 6c branching from and overlying the bottom branch channel 6a.

A gate 8 has branch gates 8a and 8b branching from one side of the branch channels 6a to 6c, i.e., from one side of a through hole of the channel 6, and passing each through hole of the channel 6, and united on the other side of the branch channels 6a to 6c, i.e., on the other side of the through hole of the channel 6.

The branch channels 6a to 6c are separated from the branch gates 8a and 8b by a gate oxide film 7.

A source/drain region (not shown) is connected to the channel 6, respectively, on the opposite sides of the branch gates 8a and 8b, i.e., on the opposite sides of the through hole of the gate 8.

The thin-film transistor constructed in this embodiment has a channel area four times that of a single-gate TFT, taking the same area, and a current capacity at least four times that of the single-gate TFT.

Since the TFT channel is surrounded by the gate, the channel is not affected by the upper and lower wiring lines, and the characteristics of the TFT are not subject to variation.

Tenth Embodiment

FIGS. 38 to 41 are exemplary diagrams of a semiconductor device fabricating method in a tenth embodiment according to the present invention for fabricating the thin-film transistor shown in the ninth embodiment.

The semiconductor device fabricating method in this embodiment will be described with reference to FIGS. 35 to 37 and 38 to 41.

Figure 38:
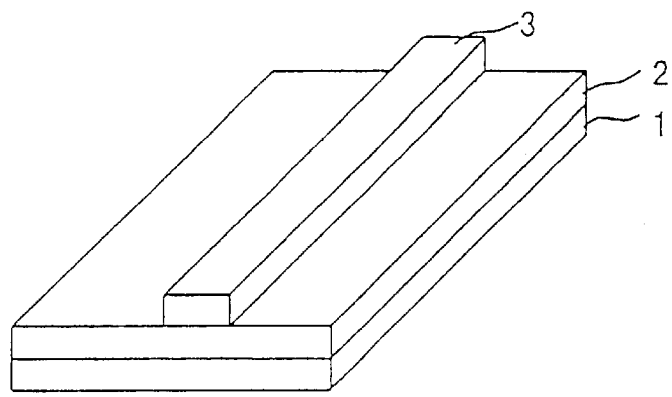
FIGS. 38 to 41 are views for explaining a semiconductor device fabricating method in a tenth embodiment of the present invention for fabricating the thin-film transistor shown in FIGS. 35 to 37.

Referring to FIG. 38, a silicon dioxide film 2 of a predetermined thickness of, for example, about 1000 Å is formed on a surface of a silicon substrate 1 by, for example, a thermal oxidation process.

A silicon nitride film 3 (first dummy member) of a predetermined thickness of, for example, about 1000 Å is formed on the silicon dioxide film 2 by a reduced pressure CVD process using a reaction temperature in the range of, for example, 700 to 800° C.

The silicon nitride film 3 is patterned in the shape of a strip of a width corresponding to the channel of a transistor to be fabricated.

A non-doped polysilicon film 4 (second dummy member) of a predetermined thickness of, for example, 1000 Å is formed on the silicon nitride film 3 by a reduced pressure CVD process using a reaction temperature in the range of, for example, 400 to 700° C.

Figure 39:
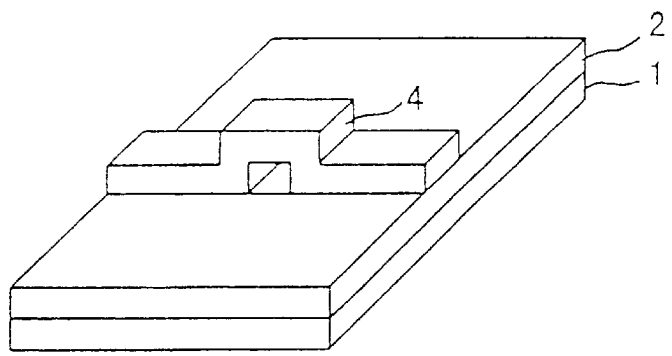

Then, the polysilicon film 4 is patterned in a desired pattern by a photolithographic etching process, as shown in FIG. 39.

Then, the silicon nitride film is removed completely by immersing the workpiece in, for example, a hot phosphoric acid solution of 150° C. Consequently, an opening is formed in the polysilicon film 4.

A silicon nitride film 5 is formed over the entire surface of the workpiece by a reduced pressure CVD process using a reaction temperature in the range of, for example, 700 to 800° C.

Figure 40:
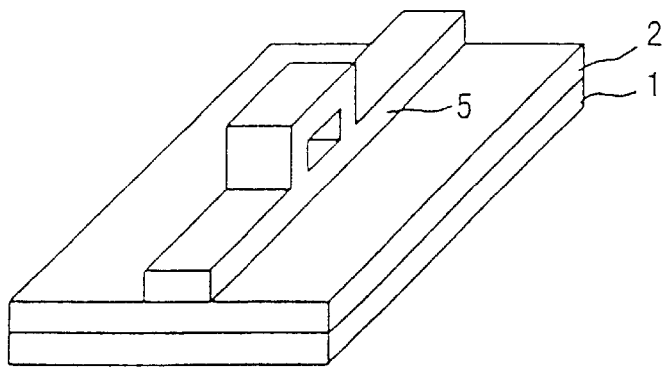

Then, the silicon nitride film 5 is patterned in a desired pattern by a photolithographic etching process, as shown in FIG. 40.

Then, the polysilicon film 4 is removed completely by, for example, an isotropic polysilicon etching process. Consequently, an opening is formed in the silicon nitride film 5.

Subsequently, a gate electrode 8 of polysilicon is formed on the surface of the workpiece. A polysilicon film 8 (i.e. a doped polysilicon film) of a thickness of, for example, about 1000 Å is formed over the entire surface of the workpiece by a reduced pressure CVD using SiH4 gas containing PH3 at a reaction temperature in the range of, for example, 500 to 700° C. The polysilicon film 8 is patterned in a desired pattern by a photolithographic etching process.

Figure 41:
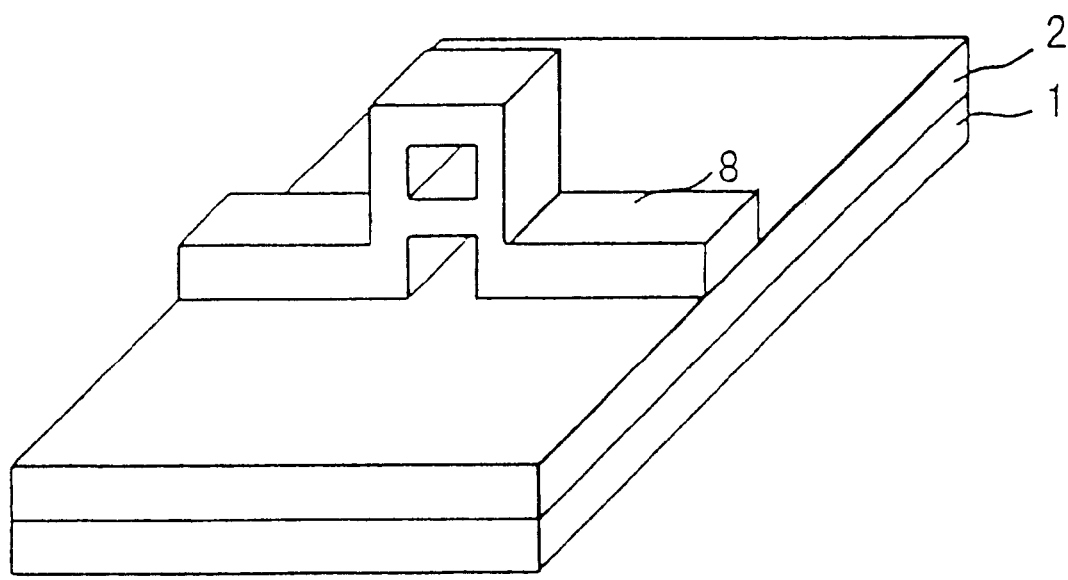

Referring to FIG. 41, the silicon nitride film 5 is removed completely by, for example, immersing the workpiece in a hot phosphoric acid solution of 150° C. Since silicon dioxide films are not corroded by the phosphoric acid solution, the silicon dioxide film 2 remains intact. Thus, an opening is formed in the gate polysilicon film 8.

Referring to FIGS. 35 to 37, a gate silicon dioxide film 7, i.e., a gate insulating film, of a predetermined thickness of, for example, 200 Å is formed over the entire surface of the workpiece by a reduced pressure CVD process using a reaction temperature in the range of, for example, 600 to 900° C. The silicon dioxide film 2 and the gate polysilicon film 8 are coated entirely with the silicon dioxide film 7.

A non-doped polysilicon is deposited by a reduced pressure CVD process or the like using a reaction temperature in the range of, for example, 400 to 700° C. to form a channel polysilicon film 6 of a predetermined thickness of, for example, 400 Å. Since films deposited by a reduced pressure CVD process have excellent coverage, the opening formed in the gate polysilicon film 8 is filled up with the channel polysilicon film 6.

The channel polysilicon film 6 is patterned in a desired pattern by a photolithographic etching process to form the channel silicon film 6 (see FIG. 35).

Although not shown, subsequently a resist mask is formed on the channel silicon film 6 by photolithography, and source/drain implantation is carried out by using the thus formed resist mask. An interlayer insulating oxide film is formed, and wiring lines of aluminum or the like are extended from the gate electrode and the source/drain region to complete a desired transistor.

The thin-film transistor constructed in this embodiment has a channel area four times that of a single-gate TFT taking the same area and a current capacity at least four times that of the single-gate TFT.

Generally in the process including the steps of a gate oxide film deposition, gate polysilicon deposition and gate polysilicon etching, etching of the gate polysilicon is difficult because of the low etching selectivity between the polysilicon and the oxide film. However, in this embodiment, the gate polysilicon film can be etched without difficulty, because the channel polysilicon film is thinner than the gate polysilicon film.

Since the TFT channel is surrounded by the gate in this embodiment, the channel is not affected by the upper and lower wiring lines, and the characteristics of the TFT are not subject to variation.

Further in this embodiment, the channel and the gate can be formed by processing a single conductive film by a single process, respectively.

Finally, the method of fabricating a semiconductor device according to this tenth embodiment may be summarized as follows.

First, a strip-shaped first dummy member is formed in a region including an element forming position on a base insulating film on a semiconductor substrate. Then, a strip-shaped second dummy member is formed so as to intersect the first dummy member at the element forming position, and the first dummy member is removed. A strip-shaped third dummy member is formed so as to intersect the second dummy member at the element forming position, and the second dummy member is removed. A strip-shaped gate conductive film for a gate is formed so as to intersect the third dummy member at the element forming position and removing the third dummy member. A surface insulating film is formed on the gate conductive film. A strip-shaped channel conductive film for a channel is formed so as to intersect the gate conductive film coated with the surface insulating film at the element forming position.

Eleventh Embodiment

Figure 42:
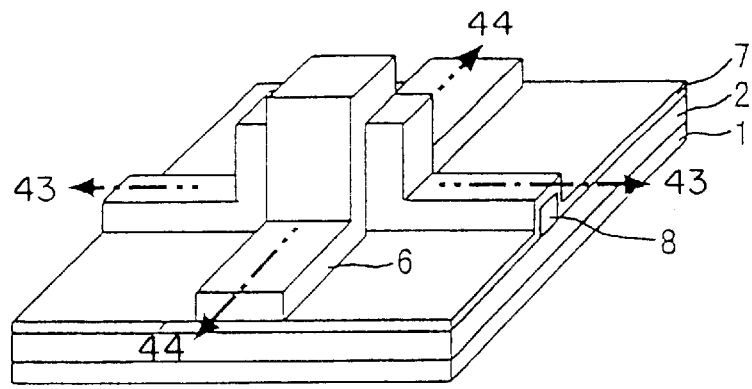
FIGS. 42 to 44 are views for explaining a structure of a semiconductor device in an eleventh embodiment of the present invention.
Figure 43:
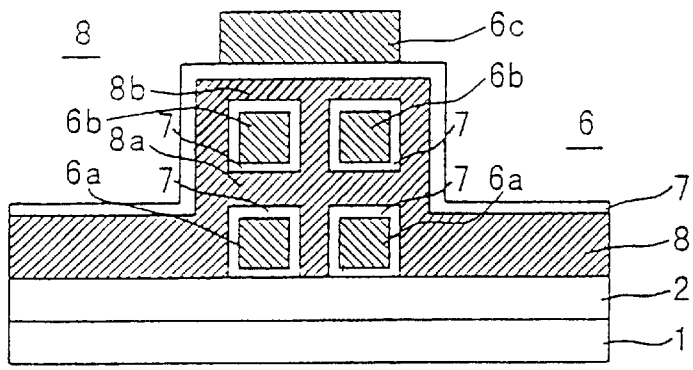
Figure 44:
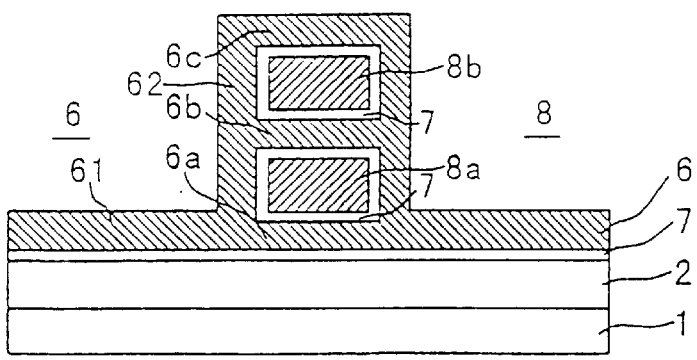

FIGS. 42 to 44 are exemplary diagrams of a structure of a semiconductor device in an eleventh embodiment according to the present invention. FIG. 42 is a perspective view of a thin-film transistor, FIG. 43 is a sectional view taken on line A-A' in FIG. 42, and FIG. 44 is a sectional view taken on line B-B' in FIG. 42.

As shown in FIGS. 42 to 44, a channel 6 in this thin-film transistor comprises a bottom branch channel 61 lying on the surface of an insulating film 2, parallel bottom branch channels 6a branching from the bottom channel 61 at an element forming position, a side channel 62 continuous with the bottom channel 61, an upper channel 6c continuous with the side channel 62, and parallel middle branch channels 6b branching from the side channel 62, lying over the parallel bottom branch channels 6a. A through hole is provided between bottom, middle and upper channels. Further, each bottom branch channel 6a and each middle branch channel 6b lying over the bottom branch channel 6a are spaced from each other.

A gate 8 has branch gates 8a and 8b branching from one side of the branch channels 6a to 6c, i.e., from one side of the through hole of the channel 6, and passing each through hole of the channel 6, and united on the other side of the branch channels 6a to 6c, i.e., the other side of the through hole of the channel 6. Further, the branch gate is filled in a space between the parallel bottom branch channels 6a, and in a space between the parallel middle branch channels 6b.

The branch channels 6a to 6c are separated from the branch gates 8a and 8b by a gate oxide film 7.

A source/drain region (not show) is connected to the channel 6, respectively, on the opposite sides of the branch gates 8a and 8b, i.e., on the opposite sides of the through hole of the gate 8.

The thin-film transistor constructed in this embodiment has a channel area four times that of a single-gate TFT, taking the same area, and a current capacity at least four times that of the single-gate TFT.

If the thickness of the channel film is not less than half the interval between the adjacent channels, the area of the channels is greater than that of a channel when the area taken by the TFT is the same.

Since the TFT channel is surrounded by the gate, the channel is not affected by the upper and lower wiring lines, and the characteristics of the TFT are not subject to variation.

Twelfth Embodiment

FIGS. 45 to 48 are exemplary diagrams of a semiconductor device fabricating method in a twelfth embodiment, according to the present invention, for fabricating the thin-film transistor shown in the eleventh embodiment.

The semiconductor device fabricating method in this embodiment will be described with reference to FIGS. 42 to 44 and 45 to 48.

Figure 45:
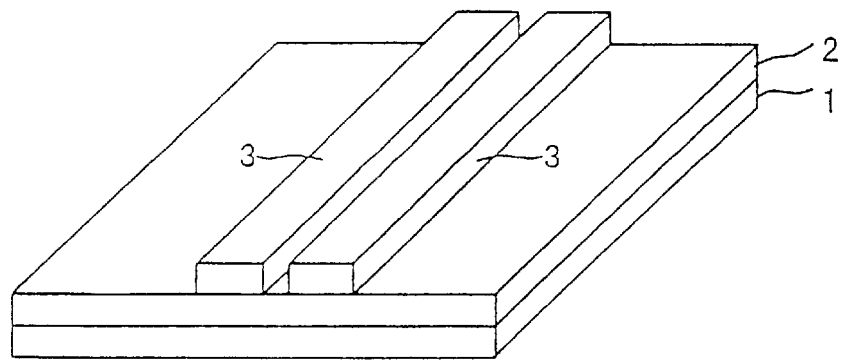
FIGS. 45 to 48 are views for explaining a semiconductor device fabricating method in a twelfth embodiment of the present invention for fabricating the thin-film transistor shown in FIGS. 42 to 44.

Referring to FIG. 45, a silicon dioxide film 2 of a predetermined thickness of, for example, about 1000 Å is formed on a surface of a silicon substrate 1 by, for example, a thermal oxidation process.

A silicon nitride film 3 (first dummy member) of a predetermined thickness of, for example, about 1000 Å is formed on the silicon dioxide film 2 by a reduced pressure CVD process using a reaction temperature in the range of, for example, 700 to 800° C.

The silicon nitride film 3 is patterned in the shape of a strip of a width corresponding to the channel of a transistor to be fabricated. The silicon nitride film 3 may be patterned in a plurality of parallel strips, if necessary.

Figure 46:
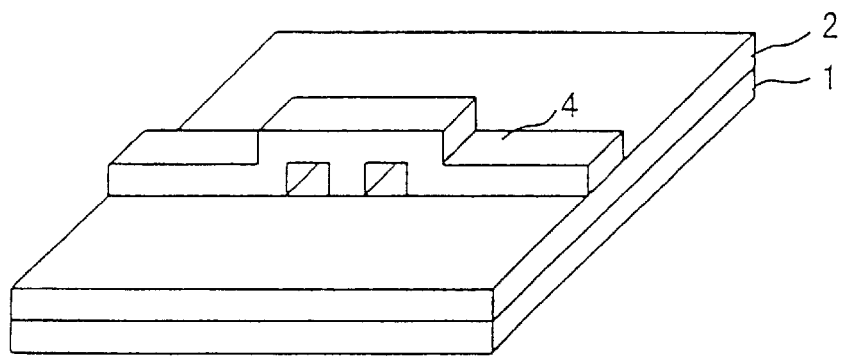

A non-doped polysilicon film 4 (second dummy member) of a predetermined thickness of, for example, 1000 Å is formed on the silicon nitride film 3 by a reduced pressure CVD process using a reaction temperature in the range of, for example, 400 to 700° C. Then, the polysilicon film 4 is patterned in a desired pattern by a photolithographic etching process, as shown in FIG. 46.

Then, the silicon nitride film 3 is removed completely by, for example, immersing the workpiece in a hot phosphoric acid solution of 150° C. Consequently, an opening is formed in the polysilicon film 4.

Figure 47:
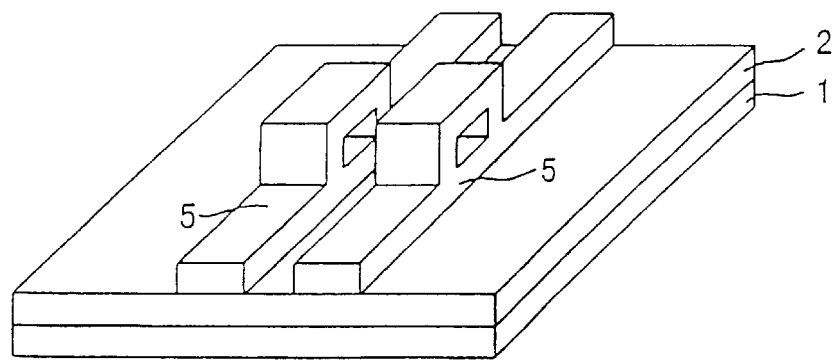

A silicon nitride film 5 (third dummy member) is formed over the entire surface of the workpiece by a reduced pressure CVD process using a reaction temperature in the range of, for example, 700 to 800° C., as shown in FIG. 47. The silicon nitride film 5 is patterned in a desired pattern by a photolithographic etching process by using a mask employed in etching the silicon nitride film 3.

Then, the polysilicon film 4 is removed completely by, for example, an isotropic polysilicon etching process. Consequently, an opening is formed in the silicon nitride film 5.

Figure 48:
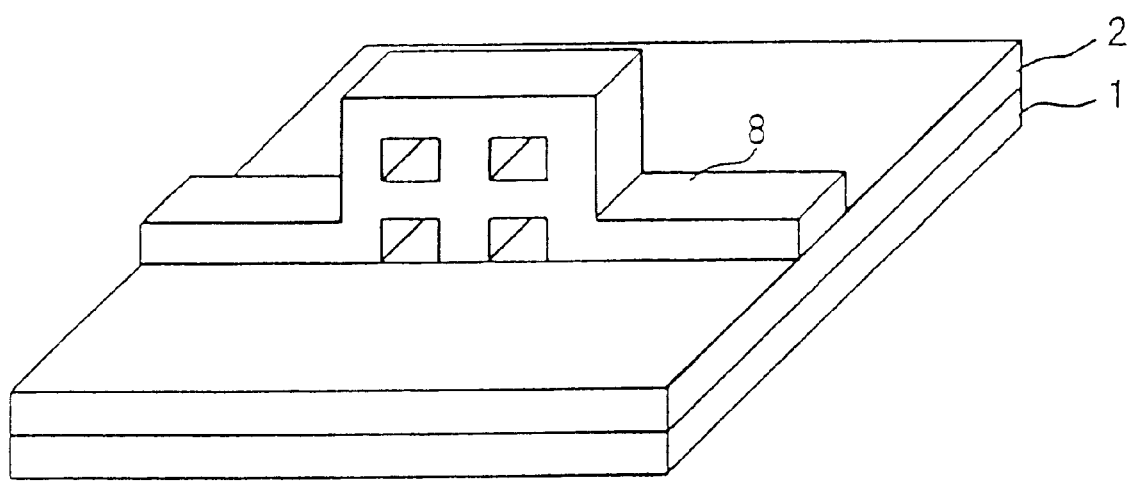
Figure 49:
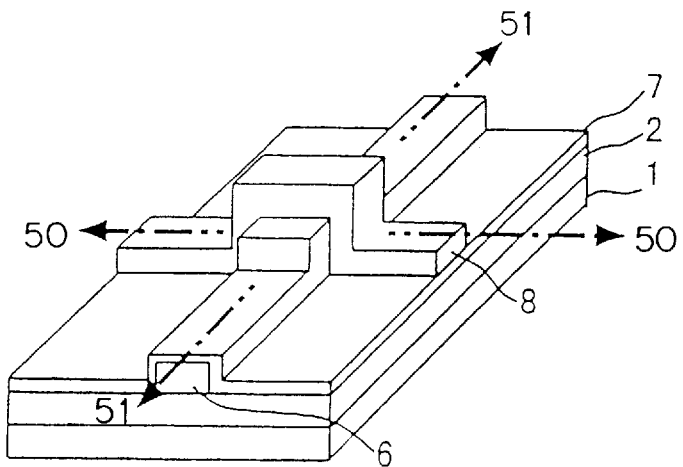
FIGS. 49 to 51 show a conventional polysilicon thin film transistor.
Figure 50:
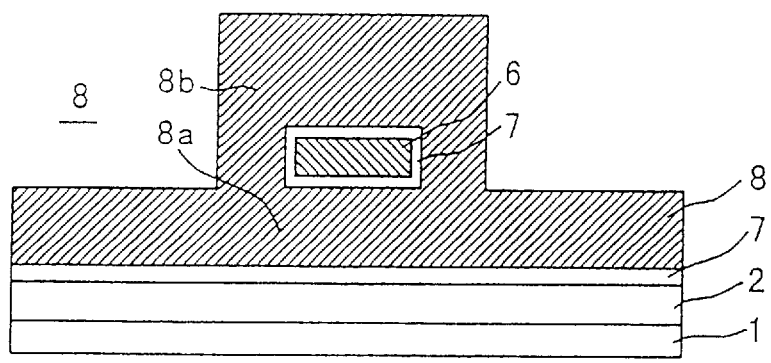
Figure 51:
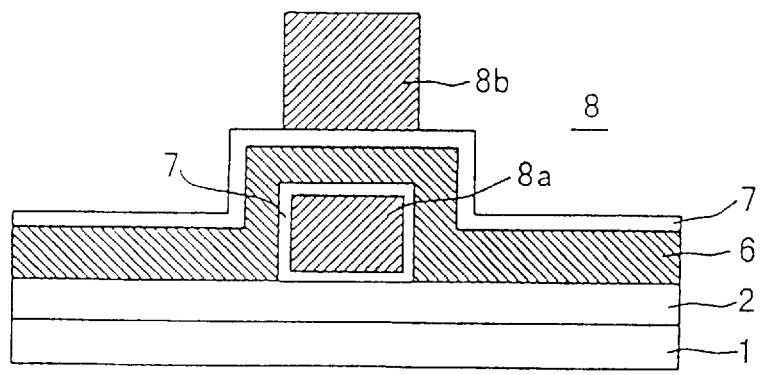
Figure 52:
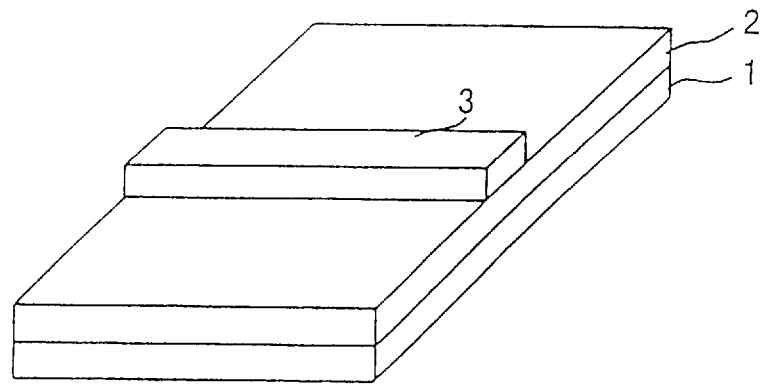
FIGS. 52 to 56 are views for explaining a method of fabricating the conventional semiconductor device shown in FIGS. 49 to 51.
Figure 53:
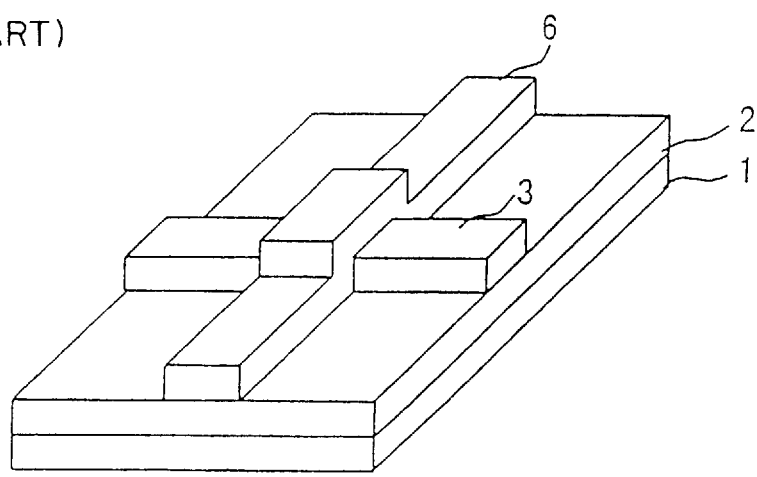
Figure 54:
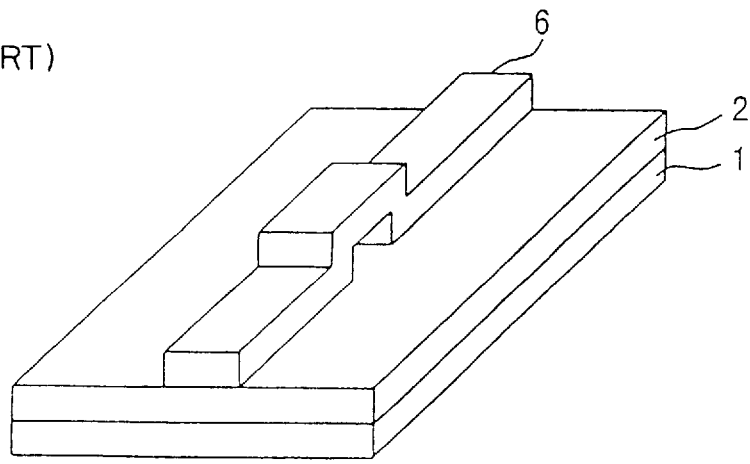
Figure 55:
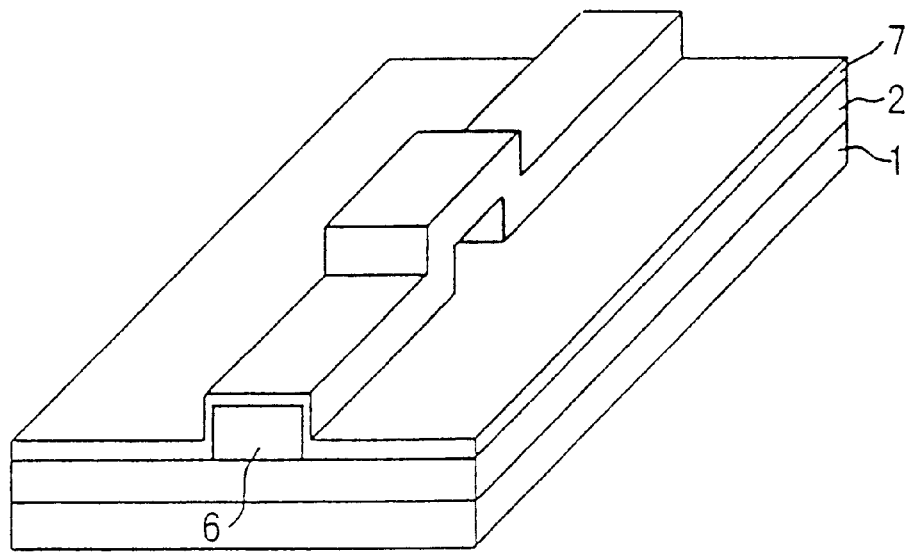
Figure 56:
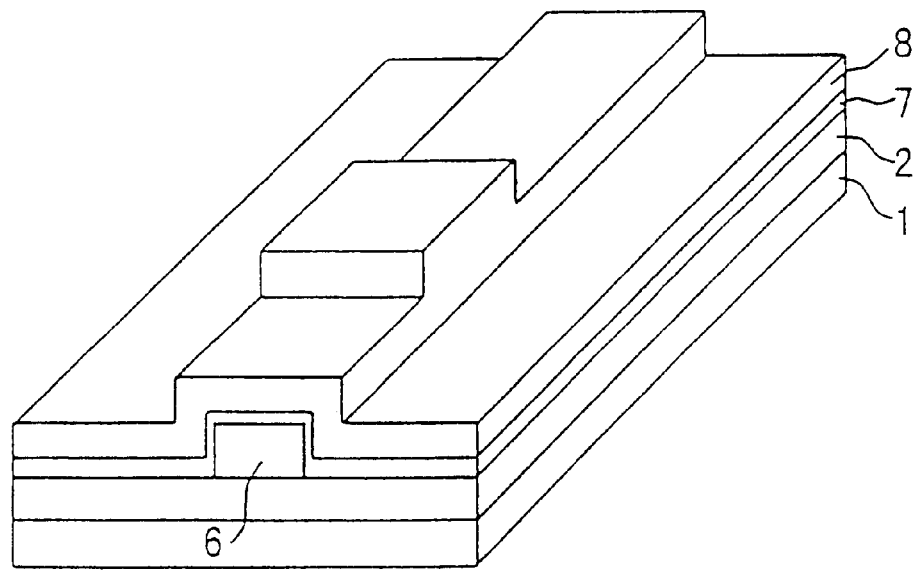

Subsequently, a gate electrode 8 of polysilicon is formed on the surface of the workpiece, as shown in FIG. 48. A polysilicon film 8 (i.e. a doped polysilicon film) of a thickness of, for example, about 1000 Å is formed over the entire surface of the workpiece by a reduced pressure CVD using $SiH_4$ gas containing $PH_3$ at a reaction temperature in the range of, for example, 500 to 700° C. The polysilicon film 8 is patterned in a desired pattern by a photolithographic etching process.

The silicon nitride film 5 is removed completely by, for example, immersing the workpiece in a hot phosphoric acid solution of 150° C. Since silicon dioxide films are not corroded by the phosphoric acid solution, the silicon dioxide film 2 remains intact. Thus, an opening is formed in the gate polysilicon film 8, forming gate electrode 8.

Referring to FIGS. 42 to 44, a gate silicon dioxide film 7, i.e., a gate insulating film, of a predetermined thickness of, for example, 200 Å is formed over the entire surface of the workpiece by a reduced pressure CVD process using a reaction temperature in the range of, for example, 600 to 900° C. The silicon dioxide film 2 and the gate polysilicon film 8 are coated entirely with the silicon dioxide film 7.

Non-doped polysilicon is deposited in a predetermined thickness of, for example, 400 Å by a reduced pressure CVD process using a reaction temperature in the range of, for example, 400 to 700° C. The opening formed in the gate polysilicon film 8 is filled up with a channel polysilicon film 6, because films deposited by a reduced pressure CVD process have excellent coverage.

The channel polysilicon film 6 is patterned in a desired pattern by a photolithographic etching process to form a channel silicon film (see FIG. 42).

Then, although not shown, a resist mask is formed on the channel silicon film 6 by photolithography, and source/drain implantation is carried out. An interlayer insulating oxide film is formed, wiring lines of aluminum or the like is extended from the gate electrode and a source/drain region to complete a desired transistor.

The thin-film transistor constructed in this embodiment has a channel area four times that of a single-gate TFT, taking the same area, and a current capacity at least four times that of the single-gate TFT.

If the thickness of the channel film is not less than half the interval between the adjacent channels, the area of the channels is greater than that of a channel when the area taken by the TFT is the same.

Since the TFT channel is surrounded by the gate, the channel is not affected by the upper and lower wiring lines, and the characteristics of the TFT are not subject to variation.

In this embodiment, the channel and the gate can be formed by processing a single conductive film by a single process, respectively.

Finally, the method of fabricating a semiconductor device according to this second embodiment may be summarized as follows.

First, a plurality of substantially parallel strip-shaped first dummy members are formed in a region including an element forming position on a base insulating film on a semiconductor substrate. Then, a strip-shaped second dummy member is formed so as to intersect the plurality of first dummy members at the element forming position and removing the first dummy members. A plurality of substantially parallel strip-shaped third dummy members are formed so as to intersect the second dummy member at the element forming position and removing the second dummy member. A strip-shaped gate conductive film for a gate is formed so as to intersect the plurality of third dummy members at the element forming position, and the plurality third dummy member are removed. A surface insulating film is formed on the gate conductive film. A strip-shaped channel conductive film for a channel is formed so as to intersect the gate conductive film coated with the surface insulating film at the element forming position.

The effects and advantages of the present invention may be summarized as follows.

In the semiconductor device according to the present invention, the channel and the gate have each the plurality of branches, and at least one or all of the branch channels are surrounded by the branch gates in a three dimensional way. The semiconductor device has a channel area three or four times (or more) than four times that of a single-gate TFT taking the same area, and a current capacity three or four times (or more) than four times that of the single-gate TFT.

Thus, the semiconductor device, particularly, the thin-film transistor, of the present invention has a small area and has a large current capacity.

Since the channel is surrounded by the gate, the channel of the semiconductor device is not affected by the upper and/or the lower wiring lines, and the characteristics of the TFT are not subject to variation.

Further, according to the present invention, the channel and the gate can be formed by processing a single conductive film respectively, so that the increase of the steps of the semiconductor device fabricating process can be suppressed.

Obviously many modifications and variations of the present invention are possible in the light of the above teachings. It is therefore to be understood that within the scope of the appended claims the invention may by practiced otherwise than as specifically described.

What is claimed is:

1. A semiconductor device, comprising: a semiconductor substrate;
    an insulating film formed on a surface of said semiconductor substrate;
    a gate including a bottom branch gate extended on a surface of said insulating film, said gate including a plurality of branch gates branching from said bottom branch gate so as to extend over said bottom branch gate,
    a plurality of gate through-holes being provided between each of said bottom branch gate and a plurality of branch gates;
    a channel branching from one side of said gate through-holes, having a plurality of branch channels, each of said branch channels passing said gate through-holes, and unified on the other side of said gate through-holes;
    a gate insulating film formed between said gate and said channel; and
    source/drain regions formed so as to be connected to said channel on opposite sides, respectively, of said gate through-holes, wherein the top layer of the semiconductor device comprises a branch gate.

2. The semiconductor device according to claim 1, wherein said channel including said plurality of branch channels and/or said gate including said plurality of branch gates are composed of a single-layer conductive film respectively.

3. The semiconductor device according to claim 1, wherein said channel and/or said gate are composed of polysilicon film respectively.

4. The semiconductor device according to claim 1, wherein said branch channels and said branch gates are formed perpendicular to each other.

5. A semiconductor device, comprising:
    a semiconductor substrate;
    an insulating film formed on a surface of said semiconductor substrate;

a gate including a bottom branch gate formed on a surface of said insulating film so as to form a tunnel on said insulating film, said gate including at least one other branch gate branching from and extending over said bottom branch gate, at least one gate through hole being provided between each of said bottom branch gate and said other branch gates;

a channel including a bottom branch channel branching from one side of said gate through-hole and passing said tunnel, said channel including at least one other branch channel passing said gate through-holes, said bottom branch channel and said other branch channels being united on the other side of said gate through-holes; and source/drain regions connected to said channel on opposite sides, respectively, of said gate through holes, wherein the top layer of the semiconductor device comprises a branch gate.

6. The semiconductor device according to claim 5, wherein said channel including said plurality of branch channels and/or said gate including said plurality of branch gates are composed of a single-layer conductive film respectively.

7. The semiconductor device according to claim 5, wherein said channel and/or said gate are composed of polysilicon film respectively.

8. The semiconductor device according to claim 5, wherein said branch channels and said branch gates are formed perpendicular to each other.

9. A semiconductor device, comprising:

a semiconductor substrate;

an insulating film formed on a surface of said semiconductor substrate;

a channel including a bottom branch channel formed on a surface of said insulating film, said channel including a plurality of other branch channels branching from and extending over said bottom branch channel, a plurality of channel through-holes being provided between said bottom branch channel and said other branch channels;

source/drain regions formed so as to be connected to said channel on the opposite ends, respectively, of said channel; and a gate including a plurality of branch gates branching from one side of said channel through-holes and passing said channel through-holes and united on the other side of said channel through-holes, wherein selected branch channels other than the uppermost branch channel are divided into a plurality of sections with gaps therebetween, and said branch gates extend in said gaps.

10. The semiconductor device according to claim 9, wherein said channel and/or said gate are composed of a single-layer conductive film respectively.

11. The semiconductor device according to claim 9, wherein said channel including said plurality of branch channels and/or said gate including said plurality of branch gates are composed of polysilicon film respectively.

12. The semiconductor device according to claim 9, wherein said branch channels and said branch gates are formed perpendicular to each other.

13. A semiconductor device, comprising:

a semiconductor substrate;

an insulating film formed on a surface of said semiconductor substrate, wherein the insulating film includes a recessed portion;

a gate including a bottom branch gate formed in the recessed portion, said gate including a plurality of branch gates branching from said bottom branch gate so as to extend over said bottom branch gate, a plurality of gate through-holes being provided between each of said bottom branch gate and a plurality of branch gates;

a channel branching from one side of said gate through-holes, having a plurality of branch channels, each of said branch channels passing said gate through-holes, and unified on the other side of said gate through-holes;

a gate insulating film formed between said gate and said channel; and source/drain regions formed so as to be connected to said channel on opposite sides, respectively, of said gate through-holes, wherein the top layer of the semiconductor device comprises a branch gate.

* * * * *